United States Patent
Tsujiuchi et al.

(10) Patent No.: US 8,581,299 B2
(45) Date of Patent: Nov. 12, 2013

(54) SEMICONDUCTOR DEVICE

(75) Inventors: Mikio Tsujiuchi, Kanagawa (JP); Tetsuya Nitta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/560,802

(22) Filed: Jul. 27, 2012

(65) Prior Publication Data

US 2013/0062662 A1 Mar. 14, 2013

(30) Foreign Application Priority Data

Sep. 14, 2011 (JP) ................................. 2011-200523

(51) Int. Cl.
*H01L 29/74* (2006.01)
*H01L 31/111* (2006.01)

(52) U.S. Cl.
USPC .................................. 257/140; 257/E27.072

(58) Field of Classification Search
USPC ........................................... 257/140, E27.072
See application file for complete search history.

(56) References Cited

U.S. PATENT DOCUMENTS

| 2005/0090051 | A1* | 4/2005 | Yi | 438/202 |
| 2005/0280029 | A1* | 12/2005 | Nakamura et al. | 257/192 |
| 2011/0127615 | A1* | 6/2011 | Tanaka | 257/378 |

FOREIGN PATENT DOCUMENTS

JP 2001-203358 7/2001

* cited by examiner

*Primary Examiner* — David S Blum
(74) *Attorney, Agent, or Firm* — McDermott Will & Emery LLP

(57) ABSTRACT

In a semiconductor device, at least one of the ratio (collector contact area/collector active area) in the High Side IGBT and the ratio (contact area on $p^+$ region/$p^+$ region area) is higher than the ratio in the Low Side IGBT. Thus, it is possible to develop without substantial changes and reduce the development burden.

16 Claims, 26 Drawing Sheets

THE CASE OF LARGE CONTACT AREA ON p+ REGION

THE CASE OF SMALL CONTACT AREA ON p+ REGION

THE CASE OF
LARGE COLLECTOR CONTACT AREA

THE CASE OF
SMALL COLLECTOR CONTACT AREA

SEMICONDUCTOR DEVICE

CROSS-REFERENCE TO RELATED APPLICATIONS

The disclosure of Japanese Patent Application No. 2011-200523 filed on Sep. 14, 2011 including the specification, drawings and abstract is incorporated herein by reference in its entirety.

BACKGROUND

The present invention relates to a semiconductor device. A lateral (horizontal) insulated gate bipolar transistor (IGBT) has been known. For example, one such lateral IGBT is disclosed in Japanese Unexamined Patent Publication No. 2001-203358.

SUMMARY

There may be a case in which a plurality of lateral IGBTs are placed in the same chip. The lateral IGBTs placed in the same chip includes a current oriented IGBT and a breakdown voltage oriented IGBT. The characteristics required for each IGBT are different. In order to improve the characteristics such as current and breakdown voltage in the lateral IGBT of the related art, it is necessary to make substantial changes and optimization, such as device size change, impurity injection layout change, and impurity injection condition change. These requirements put a heavy burden on developing all devices to meet their requirements.

The present invention has been made in the light of the above problem. Accordingly, an aspect of the present invention is to provide a semiconductor device that can be developed without substantial changes to reduce the development burden.

A semiconductor device according to an embodiment of the present invention includes a semiconductor substrate, first and second insulated gate bipolar transistors, an emitter conductive layer, and a collector conductive layer. The semiconductor substrate has a main surface. Each of the first and second insulated gate bipolar transistors is formed on the main surface, including a first conductive collector region, a first conductive base region, and a second conductive emitter region. The collector region is formed on the main surface. The base region is formed on the main surface separately from the collector region. The emitter region is formed on the main surface in the base region. The emitter conductive layer is coupled to both the base region and the emitter region in each of the first and second insulated gate bipolar transistors. The collector conductive layer is coupled to the collector region in each of the first and second insulated gate bipolar transistors. The ratio (SB11/SA11) of the area (SB11) of the junction of the base region and the emitter conductive layer in the first insulated gate bipolar transistor and the emitter conductive layer, to the area (SA11) in the main surface of the base region of the first insulated gate bipolar transistor, is grater than the ratio (SB21/SA21) of the area (SB21) of the junction of the base region and the emitter conductive layer in the second insulated gate bipolar transistor, to the area (SA21) in the main surface of the base region of the second insulated gate bipolar transistor.

Another aspect of the present invention is a semiconductor device including a semiconductor substrate, first and second insulated gate bipolar transistors, an emitter conductive layer, and a collector conductive layer. The semiconductor substrate has a main surface. Each of the first and second insulating bipolar transistors is formed on the main surface, including a first conductive collector region, a first conductive base region, and a second conductive emitter region. The collector region is formed on the main surface. The base region is formed on the main surface separately from the collector region. The emitter region is formed on the main surface in the base region. The emitter conductive layer is coupled to both the base region and the emitter region in each of the first and second insulting gate bipolar transistors. The collector conductive layer is coupled to the collector region in each of the first and second insulated gate bipolar transistors. The ratio (SB12/SA12) of the area (SB12) of the junction of the collector region and the collector conductive layer in the first insulated gate bipolar transistor, to the area (SA12) in the main surface of the collector region of the first insulated gate bipolar transistor, is greater than the ratio (SB22/SA22) of the area (SB22) of the junction of the collector region and the collector conductive layer in the second insulated gate bipolar transistor, to the area (SA22) in the main surface of the collector region of the second insulated gate bipolar transistor.

According to the present embodiment, by changing the area of the junction of one region and one conductive layer in the first and second gate bipolar transistors, the characteristics of the insulating bipolar transistor can be easily improved. Thus, it is possible to achieve a semiconductor device that can be developed without substantial changes to reduce the development burden.

BRIEF DESCRIPTION OF THE DRAWINGS

FIGS. 2A and 2B are image diagrams of the semiconductor device according to the first embodiment of the present invention applied to the PDP scan driver, in which FIG. 2A shows the top layout of the entire chip and FIG. 2B shows the top layout of 1 bit of FIG. 2F;

DETAILED DESCRIPTION

Hereinafter, the embodiments of the present invention will be described with reference to the accompanying drawings.
First Embodiment First, the configuration of a semiconductor device according to a first embodiment of the present invention will be described with reference to FIGS. 1 to 6.

Figure 1:
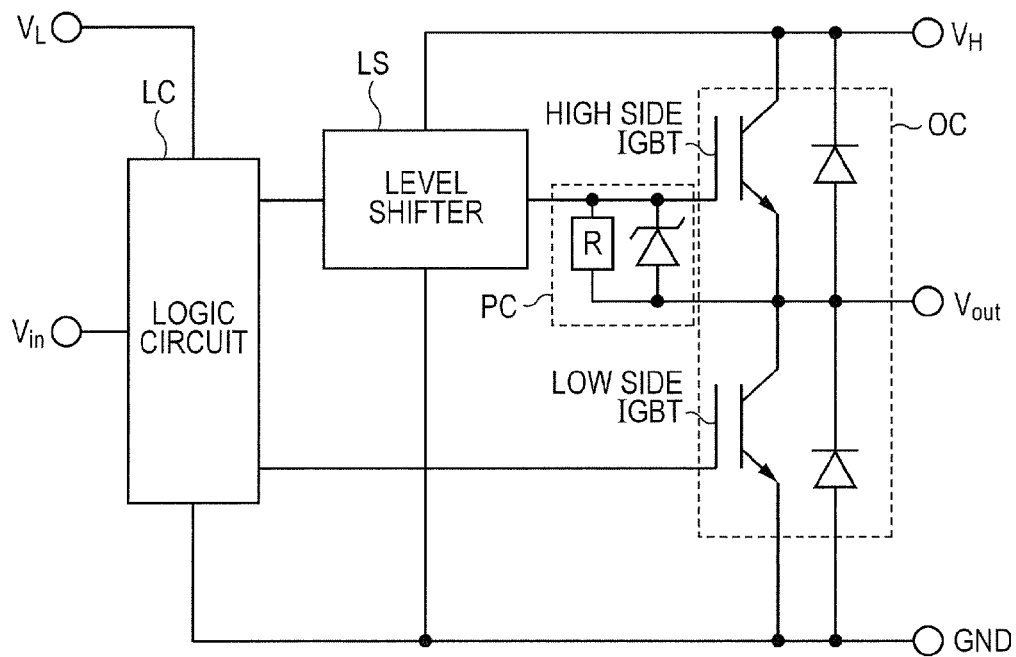
FIG. 1 is a circuit diagram of a semiconductor device according to a first embodiment of the present invention, in which the semiconductor device is applied to a plasma display panel (PDP) scan driver.
Figure 2:
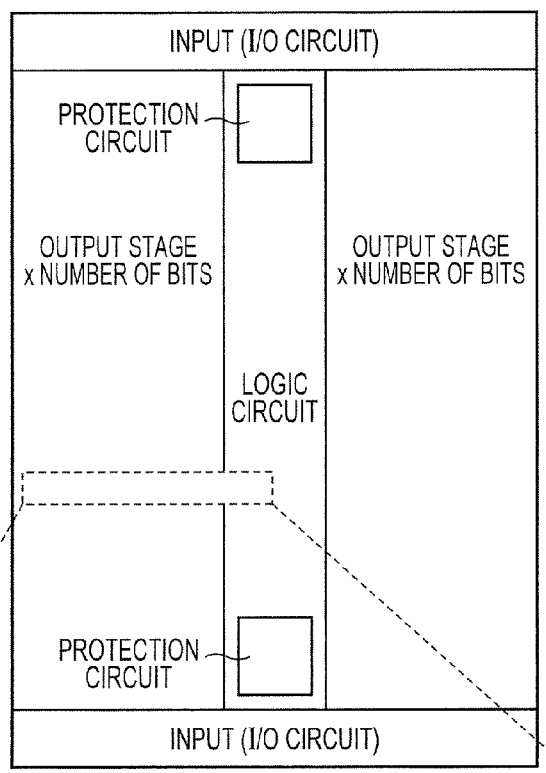
Figure 2:
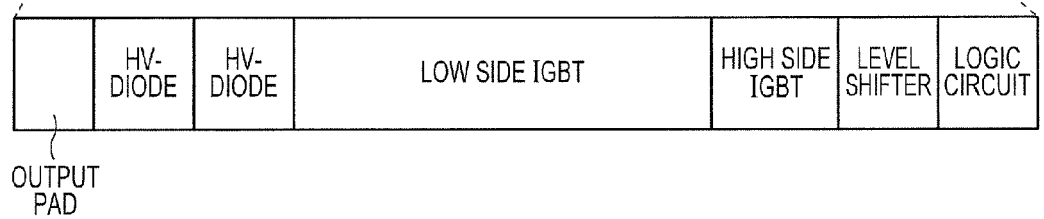

Referring to FIG. 1, a PDP scan driver circuit includes an output circuit OC, a level shifter unit LS, a logic circuit unit LC, and a protection circuit unit PC. The output circuit unit OC includes a totem pole circuit using two IGBTs as a Low Side main switch device and a High Side main switch device. The totem pole circuit is coupled between a terminal supplied with a first drive voltage ($V_H$) and a terminal supplied with a second drive voltage (GND). At the same time, the totem pole circuit supplies an AC output $V_{out}$ to a load from an output terminal. A diode is coupled with reverse polarity between an emitter and a collector in each of the Low Side IGBT and the High Side IGBT.

The logic circuit unit LC is coupled to the gate electrode of the Low Side IGBT of the output circuit unit OC. Further, the logic circuit unit LC is coupled to the gate electrode of the High Side IGBT through the level shifter unit LS and the protection circuit unit PC.

Referring to FIG. 2A, in a semiconductor chip of the PDP scan driver, output stages corresponding to the number of bits are provided on the left and right sides of the figure so that the protection circuit unit PC and the logic circuit unit LC are interposed between the output stages. Further, input/output (I/O) circuit units are provided on the top and bottom of the figure so that the output stages and the logic circuit unit LC are interposed between the input/output circuit units.

Referring to FIG. 2B, the output stage for one bit includes the level shifter unit, High Side IGBT, Low Side IGBT, diodes, and an output pad.

Figure 3:
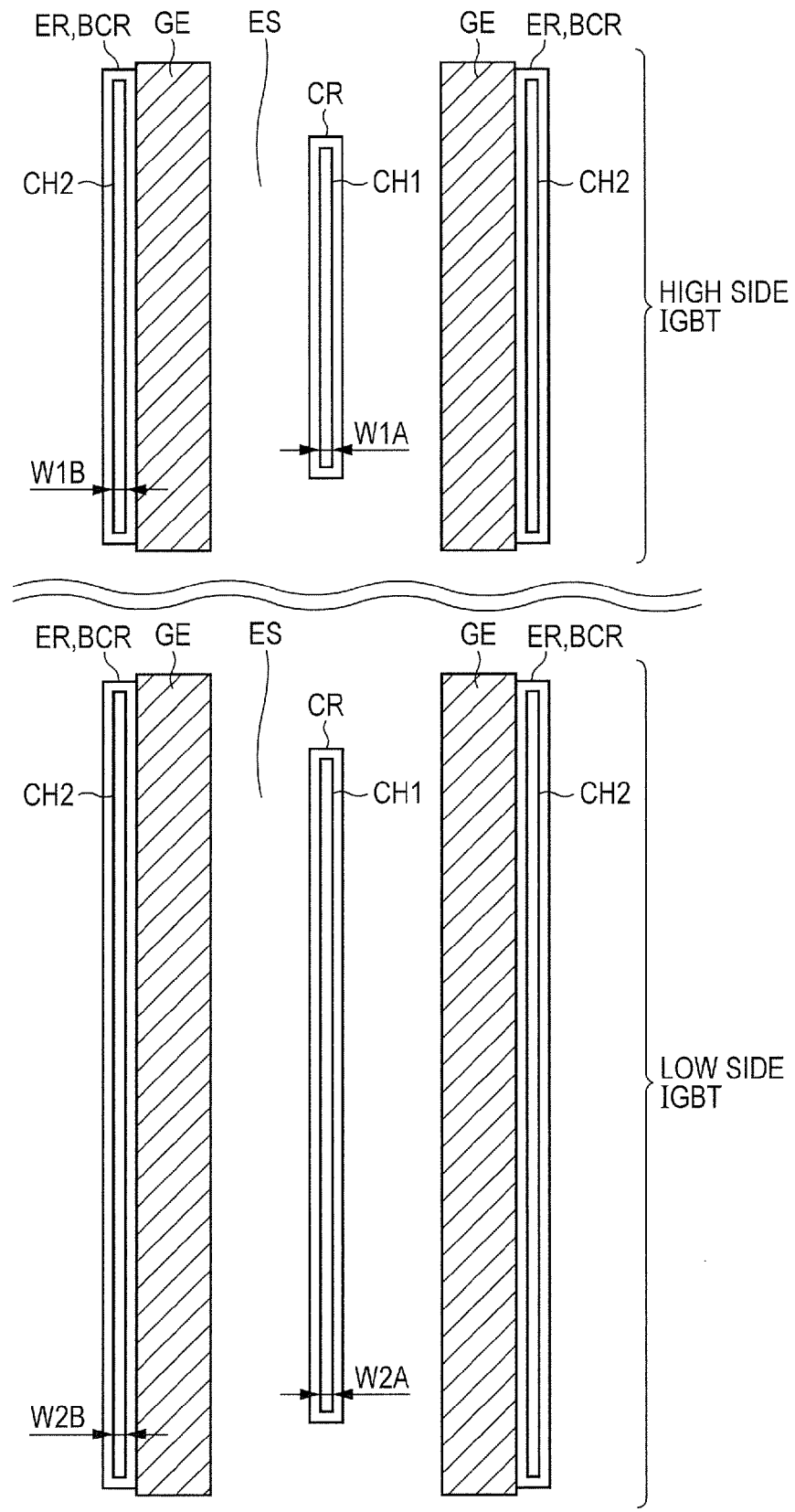
FIG. 3 is a top view schematically showing the configuration of High Side IGBT and Low Side IGBT shown in FIG. 1 and FIGS. 2A and 2B.

Referring to FIG. 3, the High Side IGBT is, for example, the breakdown voltage oriented device, and the Low Side IGBT is, for example, the current oriented device. The High Side IGBT is designed to increase the breakdown voltage by reducing the impurity concentration of the drift region and increasing the length between the collector and the emitter of the drift region, compared to the case of the Low Side IGBT. Further, the Low Side IGBT is designed to increase the current driving capability by increasing the channel width grater, reducing the channel length, and reducing the channel resistance, compared to the case of the High Side IGBT.

Figure 5:
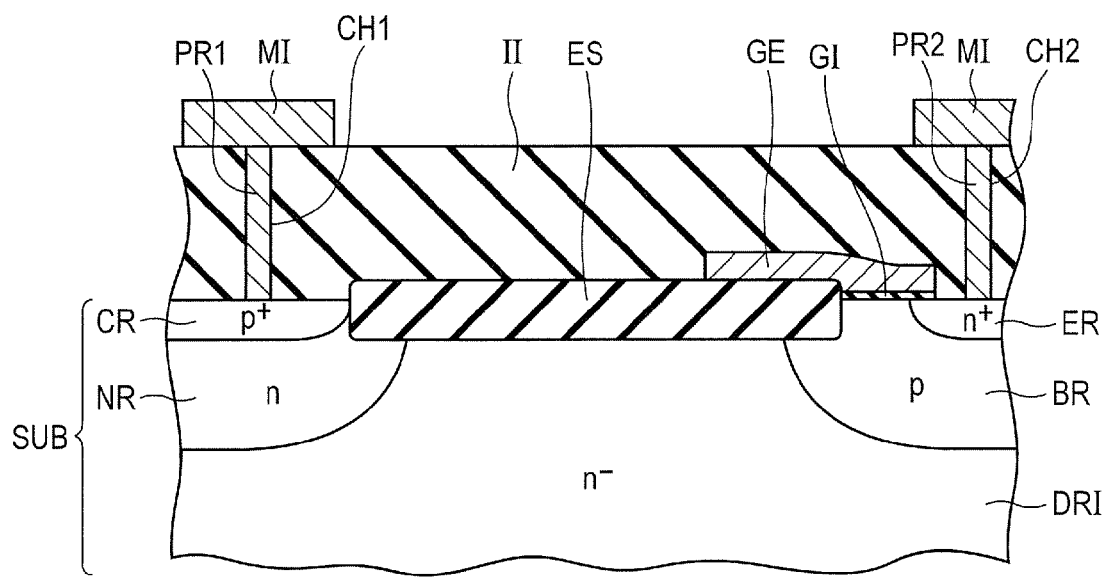
FIG. 5 is a schematic cross-sectional view taken along line V-V of FIG. 4.
Figure 6:
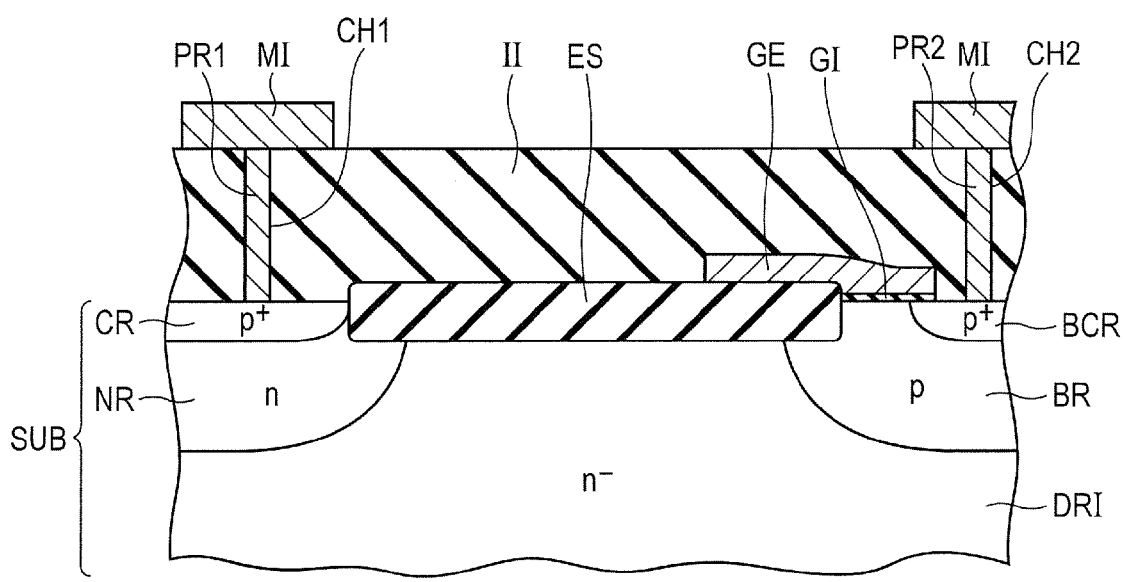
FIG. 6 is a schematic cross-sectional view taken along line VI-VI of FIG. 4.

Referring to FIGS. 5 and 6, the High Side IGBT and the Low Side IGBT mainly include an $n^-$ drift region DRI, an n-type region NR, a $p^+$ collector region CR, p-type base region BR, BCR, an $n^+$ emitter region ER, a gate insulating film GI, and a gate electrode layer GE.

The $n^-$ drift region DRI is formed in a semiconductor substrate SUB. The n-type region NR is formed in the semiconductor substrate SUB so as to contact the $n^-$ drift region DRI. The $p^+$ collector region CR is formed in the semiconductor substrate SUB to form a pn junction with the n-type region NR on the main surface of the semiconductor substrate SUB.

The p-type base region BR, BCR is formed in the semiconductor substrate SUB to form a pn junction with the n⁻ drift region DRI on the main surface of the semiconductor substrate SUB. The p-type base region BR, BCR includes a p-type region BR forming a pn junction with the n⁻ drift region DRI, and the p⁺ base contact region BCR located on the main surface of the semiconductor substrate SUB in the p-type region BR. The p⁺ base contact region BCR has a p-type impurity concentration that is higher than in the p-type region BR. The n⁺ emitter region ER is formed in the semiconductor substrate SUB to form a pn junction with the p-type base region BR, BCR on the main surface of the semiconductor substrate SUB.

A device isolation structure ES is formed on the main surface of the semiconductor substrate SUB interposed between the p⁺ collector region CR and the p-type base region BR, BCR. For example, the device isolation structure ES may be a silicon oxide film, which is formed by a local oxidation of silicon (LOCOS), or may be shallow trench isolation (STI).

A gate electrode layer GE is formed at least over the p-type region BR interposed between the n⁺ emitter region ER and the n⁻ drift region DRI, through a gate insulating film GI. One end portion of the gate electrode layer GE overlaps the device isolation structure ES, facing the n⁻ drift region DRI with the device isolation structure ES interposed therebetween.

An interlayer insulating film II is formed over the main surface of the semiconductor substrate SUB in which the IGBT is formed. The interlayer insulating film II covers the IGBT. Contact recesses CH1 and CH2 are formed in the interlayer insulating film II. The contact recess CH1 is formed to reach the p⁺ collector region CR from the top of the interlayer insulating film II. The contact recess CH2 is formed to reach both the n⁺ emitter region ER and the p⁺ base contact region BCR from the top of the interlayer insulating film II.

A plug layer (collector conductive layer) PR1 of a conductive material is inserted into the contact recess CH1. Further, a plug layer (emitter conductive layer) PR2 of a conductive material is inserted into the contact recess CH2. Metal lines MI are formed on the interlayer insulating film II to contact the plug layers PR1 and PR2, respectively.

Figure 4:
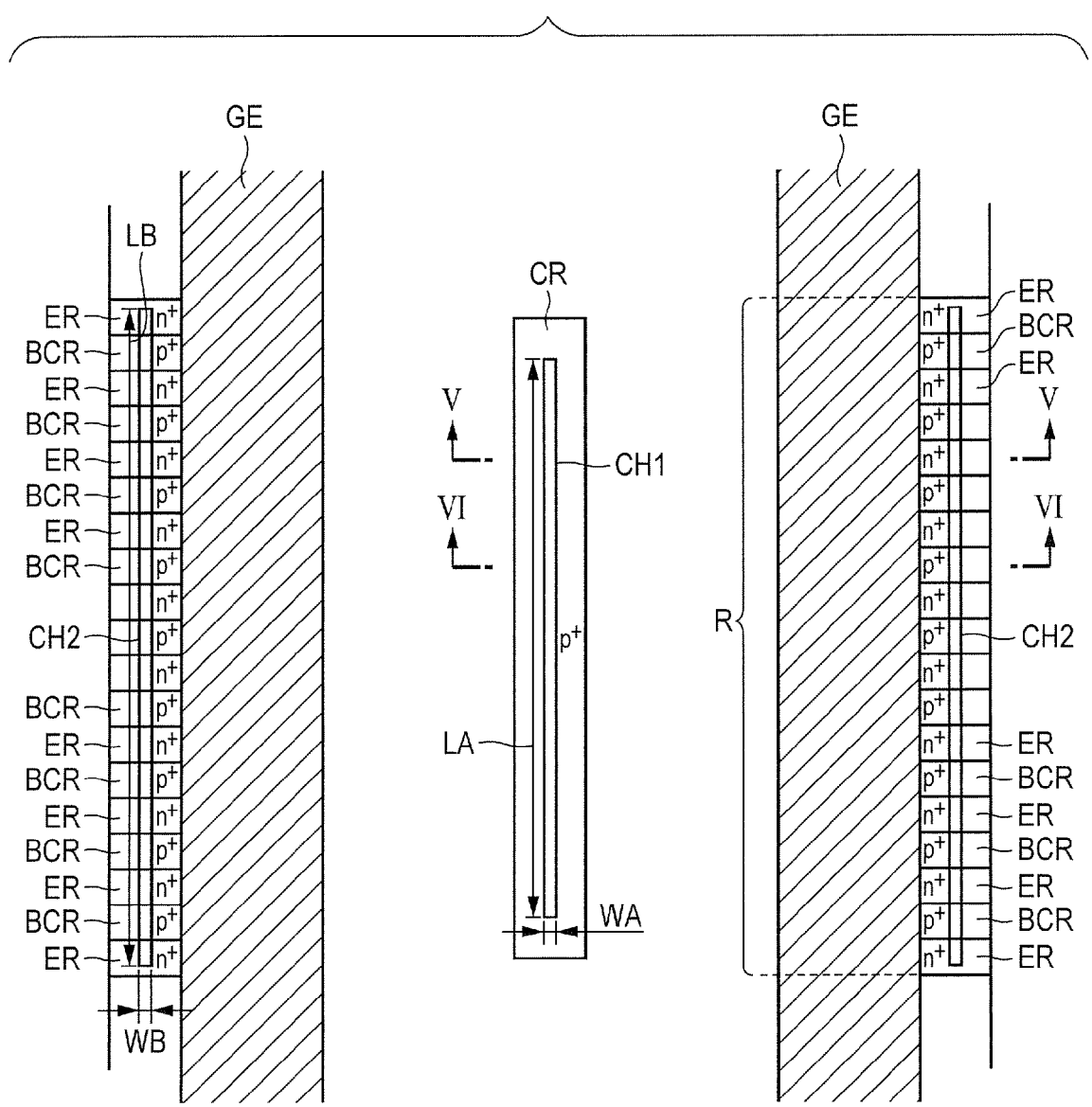
FIG. 4 is an enlarged top view of the IGBT shown in FIG. 3.

Referring to FIG. 4, for example, both the contact recesses CH1 and CH2 have a line contact (slit contact) structure. The line contact structure is the structure in which the contact recess has a rectangular shape (including a rounded rectangular shape) in the top view. In this structure, the length (for example, length LA, LB) of one side of the rectangular contact recess, is two times longer than the length (for example, line width WA, WB) of the other side.

The contact recess CH1 is formed to reach the p⁺ collector region CR, so that the plug layer PR1 inserted into the contact recess CH1 is coupled to the p⁺ collector region CR.

A plurality of n⁺ emitter regions ER and a plurality of p⁺ base contact regions BCR are alternately arranged in one IGBT along the gate width direction (the vertical direction in the figure). The emitter-side contact recess CH2 is formed to reach the n⁺ emitter regions ER and the p⁺ base contact regions BCR, respectively. In this way, the plug layer PR2 inserted into the contact recess CH2 is coupled to the n⁺ emitter regions ER and the p⁺ base contact regions BCR, respectively.

Referring to FIG. 3, the ratio (the contact area on the p⁺ region/the p⁺ region area: SB11/SA11) of the area (the contact area on the p⁺ region: SB11) of the junction of the plug layer PR2 and the p⁺ base contact region BCR, to the area (the p⁺ region area: SA11) of the area of the p⁺ base contact region BCR in the main surface of the semiconductor substrate SUB of the High Side IGBT, is greater than the ratio (the contact area on the p⁺ region/the p⁺ region area: SB21/SA21) of the area (the contact area on the p⁺ region: SB21) of the junction of the plug layer PR2 and the p⁺ base contact region BCR, to the area (the p⁺ region area: SA21) of the p⁺ base contact region BCR in the main surface of the semiconductor substrate SUB of the Low Side IGBT.

Further, the ratio (the collector contact area/the collector active area: SB12/SA12) of the area (the collector contact area: SB12) of the junction of the plug layer PR1 and the p⁺ collector region CR to the area (the collector active area: SA12) of the area of the p⁺ collector region CR in the main surface of the semiconductor substrate SUB of the High Side IGBT, is greater than the ratio (the collector contact area/the collector active area: SB22/SA22) of the area (the collector contact area: SB22) of the junction of the plug layer PR1 and the p⁺ collector region CR to the area (the collector active area: SA22) of the p⁺ collector region CR in the main surface of the semiconductor substrate SUB of the Low Side IGBT. Here, the area of the p⁺ collector region CR (the collector active area) corresponds to the area of the p⁺ collector region CR surrounded by the device isolation structure ES.

Here, as shown in FIG. 4, the ratio (the contact area on the p⁺ collector region CR/the p⁺ region area) is defined by the p⁺ region area and the contact area on the p⁺ region in a layout region R that is interposed between the n⁺ emitter regions ER, in which the n⁺ emitter regions ER and the p⁺ base contact regions BCR are arranged in the gate width direction.

In other words, the area (the p⁺ region area) of the p⁺ base contact region BCR is the sum of the areas of the p⁺ base contact regions BCR in the layout region R that is interposed between the n⁺ emitter regions ER as shown in FIG. 4. Further, the area (the contact area on the p⁺ region) of the junction of the plug layer PR2 and the p⁺ base contact region BCR is the sum of the areas of the junctions of the plug layer PR2 and the p⁺ base contact regions BCR in the layout region R that is interposed between the n⁺ emitter regions ER as shown in FIG. 4.

Note that it is enough that at least one of the ratio (the collector contact area/the collector active area) and the ratio (the contact area on the p⁺ region/the p⁺ region area) in the High Side IGBT is higher than in the Low Side IGBT. For example, it is possible that the ratio (the collector contact area/the collector active area) of the High Side IGBT and the ratio (the collector contact area/the collector active area) of the Low Side IGBT are the same, and that the ratio (the contact area on the p⁺ region/the p⁺ region area) of the High Side IGBT is higher than the ratio (the contact area on the p⁺ region/the p⁺ region area) of the Low Side IGBT. Further, it is also possible, for example, that the ratio (the contact area on the p⁺ region/the p⁺ region area) of the High Side IGBT and the ratio (the contact area on the p⁺ region/the p⁺ region area) of the Low Side IGBT are the same, and that the ratio (the collector contact area/the collector active area) of the High Side IGBT is higher than the ratio (the collector contact area/the collector active area) of the Low Side IGBT. In addition, it is also possible, for example, that the ratio (the contact area on the p⁺ region/the p⁺ region area) of the High Side IGBT is higher than the ratio (the contact area on the p⁺ region/the p⁺ region area) of the Low Side IGBT, and that the ratio (the collector contact area/the collector active area) of the High Side IGBT is higher than the ratio (the collector contact area/the collector active area) of the Low Side IGBT.

Here, the junction of the plug layer PR1 and the p⁺ collector region CR, namely, the junction in the contact recess CH1 in each of the High Side IGBT and the Low Side IGBT has the line contact structure. In this case, preferably, a line width W1A of the junction of the plug layer PR1 and the p⁺ collector region CR in the High Side IGBT is greater than a line width W2A of the junction of the plug layer PR1 and the p+ collector region CR in the Low Side IGBT.

Further, the junction of the plug layer PR2 and the p+ base contact region BCR, namely, the junction in the contact recess CH2 in each of the High Side IGBT and the Low Side IGBT has the line contact structure. In this case, preferably, a line width W1B of the junction of the plug layer PR2 and the p+ base contact region BCR in the High Side IGBT is greater than a line width W2B of the junction of the plug layer PR2 and the p+ base contact region BCR in the Low Side IGBT.

Next, studies conducted by the inventors on the relationship between the ratios and the characteristics of the IGBT will be described with reference to FIGS. 7 to 12.

Figure 8:
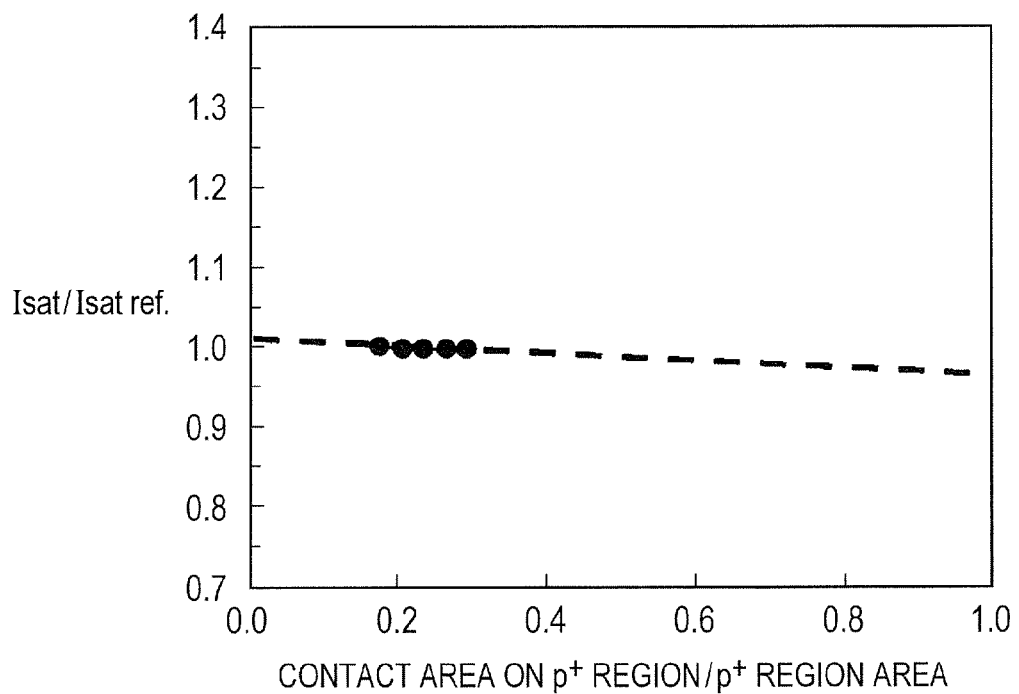
FIG. 8 is a view of the relationship between the saturated current and the ratio of the contact area to the area of the base contact region in the semiconductor device according to the first embodiment of the present invention.
Figure 9:
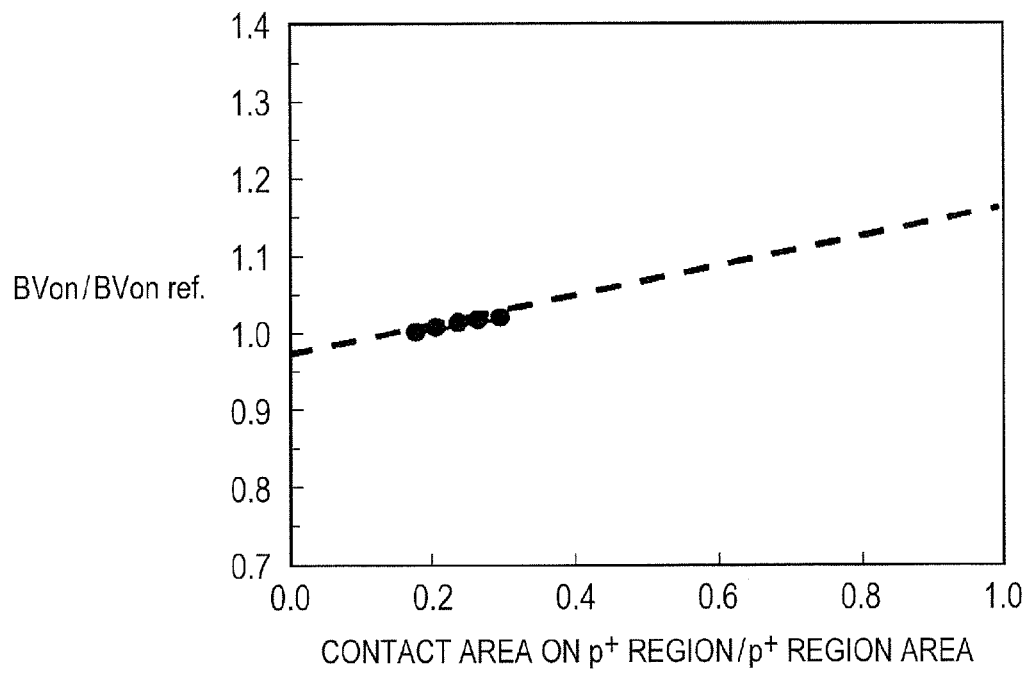
FIG. 9 is a view of the relationship between the on-stand breakdown voltage and the ratio of the contact area to the area of the base contact region in the semiconductor device according to the first embodiment of the present invention.

First, the inventors have examined that the characteristics of the IGBT (linear current, saturated current, on-state breakdown voltage) vary due to the change in the ratio (the contact area on the p+ region/the p+ region area). The examination has been conducted by changing only the ratio (the contact area on the p+ region/the p+ region area) while the ratio (the collector contact area/the collector active area) of the IGBT having the structure shown in FIG. 4 is kept constant. The results are shown in FIGS. 7 to 9.

Figure 7:
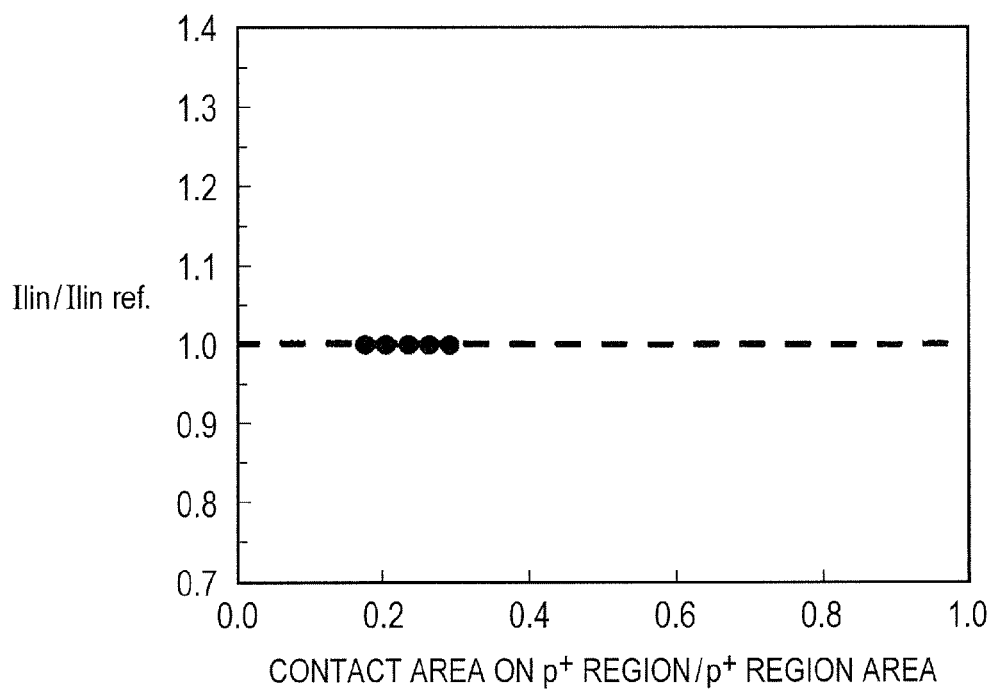
FIG. 7 is a view of the relationship between the linear current and the ratio of the contact area to the area of the base contact region in the semiconductor device according to the first embodiment of the present invention.

From the result shown in FIG. 7, it is found that the linear current hardly changes when the ratio (the contact area on the p+ region/the p+ region area) is changed. However, from the result shown in FIG. 8, it is found that the saturated current is improved by reducing the ratio (the contact area on the p+ region/the p+ region area). On the other hand, from the result shown in FIG. 9, it is found that the on-state breakdown voltage is improved by increasing the ratio (the contact area on the p+ region/the p+ region area).

The inventors have also examined that the characteristics of the IGBT (linear current, saturated current, on-state breakdown voltage) vary due to the ratio (the collector contact area/the collector active area). The examination has been conducted by only changing the ratio (the collector contact area/the collector active area) while the ratio (linear current, saturated current, on-state breakdown voltage) of the IGBT having the structure shown in FIG. 4 is kept constant. The results are shown in FIGS. 10 to 12.

Figure 10:
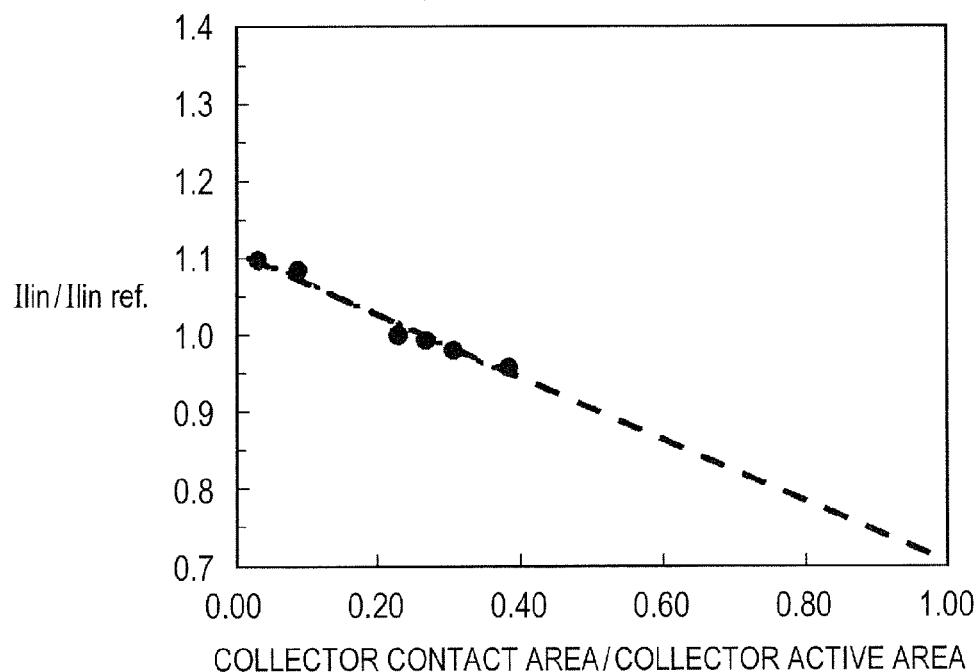
FIG. 10 is a view of the relationship between the linear current and the ratio of the contact area to the area of the collector region in the semiconductor device according to the first embodiment of the present invention.
Figure 11:
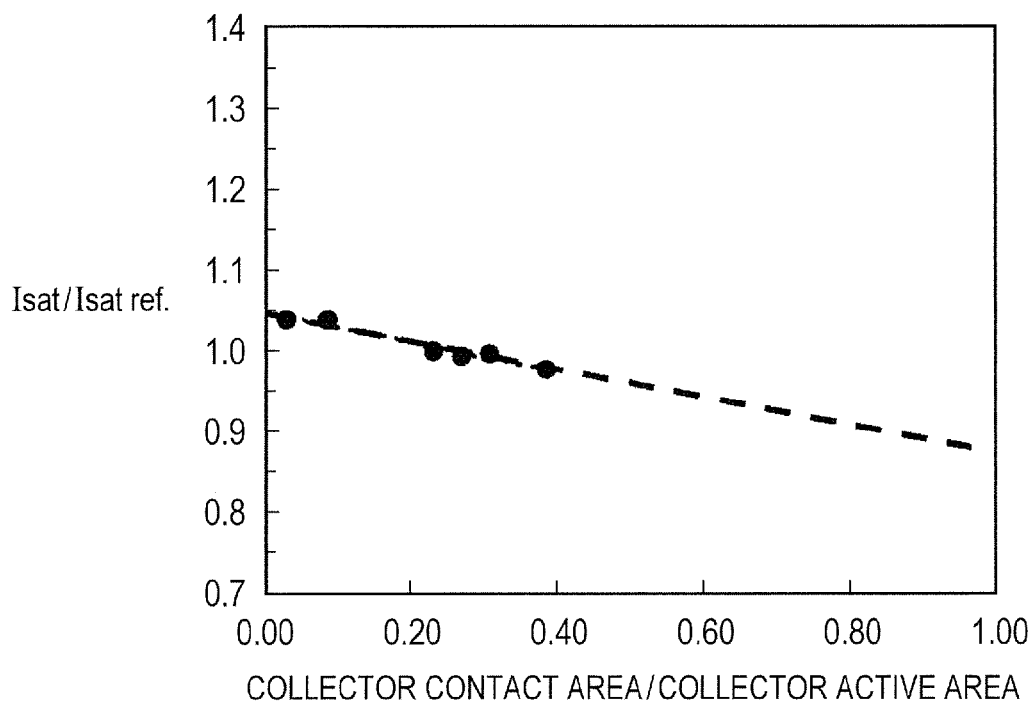
FIG. 11 is a view of the relationship between the saturated current and the ratio of the contact area to the area of the collector region in the semiconductor device according to the first embodiment of the present invention.

From the results shown in FIGS. 10 and 11, it is found that both the linear current and the saturated current are improved when the ratio (the collector contact area/the collector active area) is reduced. Further, from the result shown in FIG. 12, it is found that the on-stand breakdown voltage is improved by increasing the ratio (the collector contact area/the collector active area).

Figure 12:
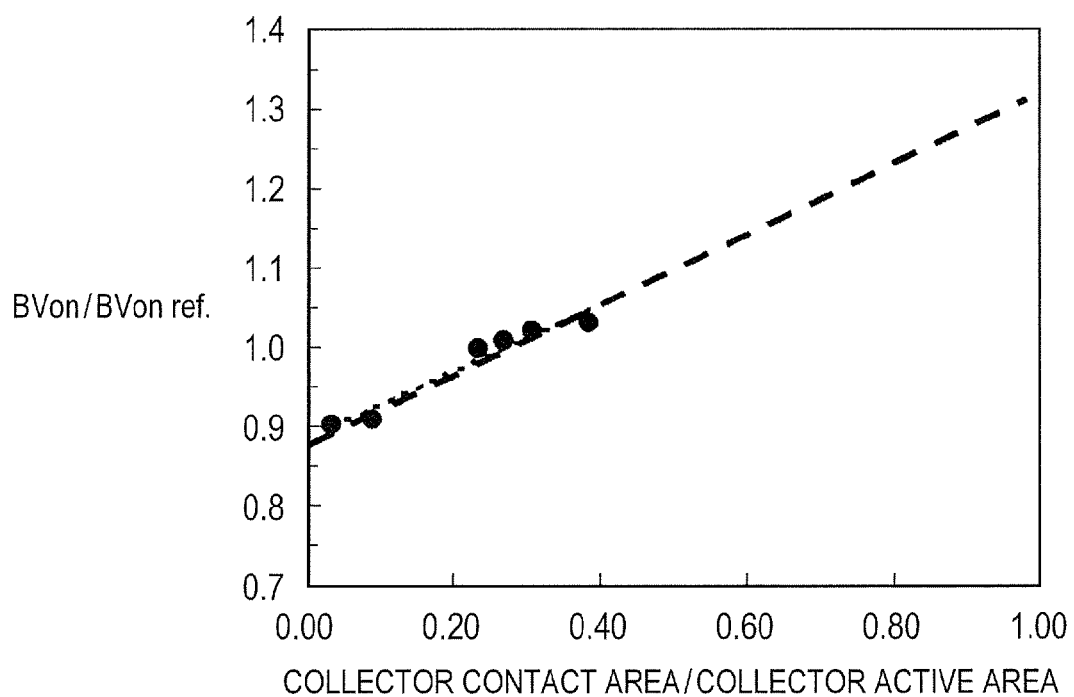
FIG. 12 is a view of the relationship between the on-stand breakdown voltage and the ratio of the contact area to the area of the collector region in the semiconductor device according to the first embodiment of the present invention.

Further, when both the ratio (the contact area on the p+ region/the p+ region area) and the ratio (the collector contact area/the collector active area) are changed, the result is substantially the same as in the case in which only the ratio (the collector contact area/the collector active area) is changed as shown in FIGS. 10 to 12.

From the results shown in FIGS. 7 to 12, in the breakdown voltage oriented IGBT, it is effective that at least one of the two ratios, the ratio (the contact area on the p+ region/the p+ region area) and the ratio (the collector contact area/the collector active area), is greater than the other, from the point of view of the improvement of the on-state breakdown voltage. Further, in the current oriented IGBT, it is effective that at least one of the two ratios, the ratio (the contact area on the p+ region/the p+ region area) and the ratio (the collector contact area/the collector active area), is smaller than the other, from the point of view of the improvement of the linear current and the saturated current.

Next, the reason for the results shown in FIGS. 7 to 12 will be discussed with reference to FIGS. 13 to 17.

Figure 13:
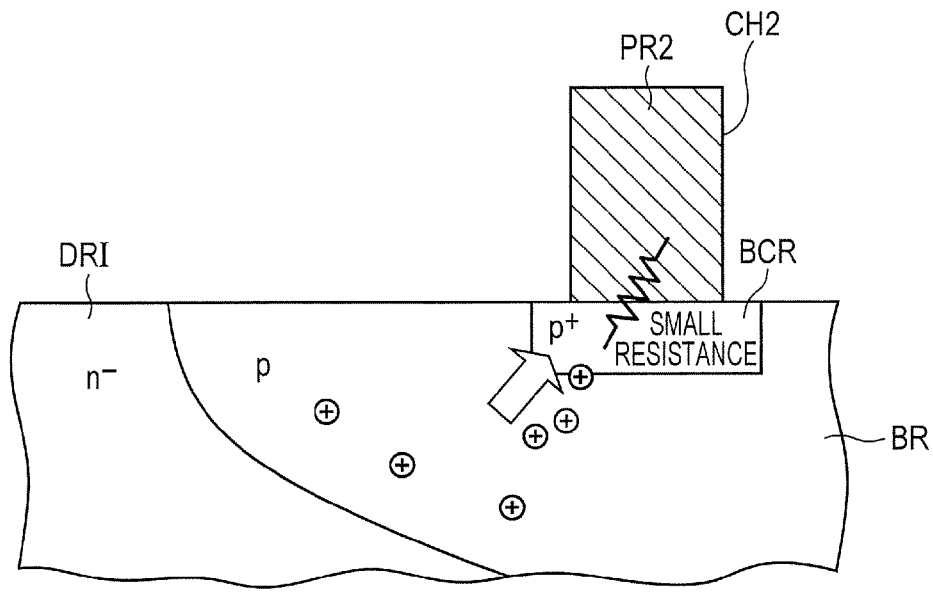
FIG. 13 is a schematic cross-sectional view illustrating the change in the characteristics of the IGBT when the contact area is large in the base contact region.

Referring to FIG. 13, when the contact area on the p+ region is large, the contact resistance between the plug layer PR2 and the p+ base contact region BCR is reduced. Thus, the extraction efficiency of holes (electron holes) from the p-type region BR is increased. This would prevent the holes from being accumulated in the p-type region BR, resulting in the improvement of the on-state breakdown voltage.

Figure 14:
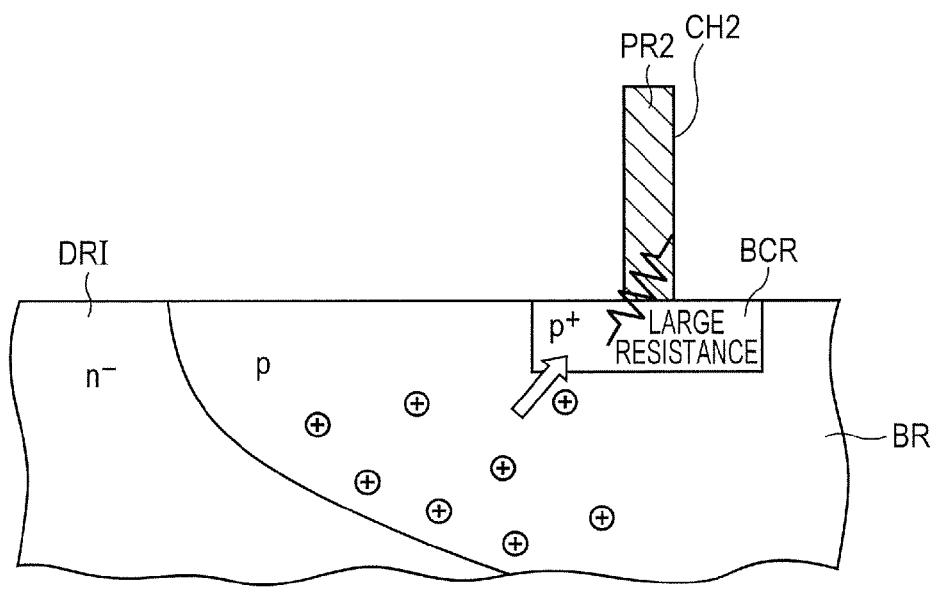
FIG. 14 is a schematic cross-sectional view illustrating the change in the characteristics of the IGBT when the contact area in the base contact region is small.

Referring to FIG. 14, when the contact area on the p+ region is small, the contact resistance between the plug layer PR2 and the p+ base contact region BCR is increased. Thus, the extraction efficiency of holes from the p-type region BR is reduced. This would allow the holes to be easily accumulated in the p-type region BR. As a result, the base potential rises from the ground voltage, preventing the improvement of the on-state breakdown voltage.

Figure 15:
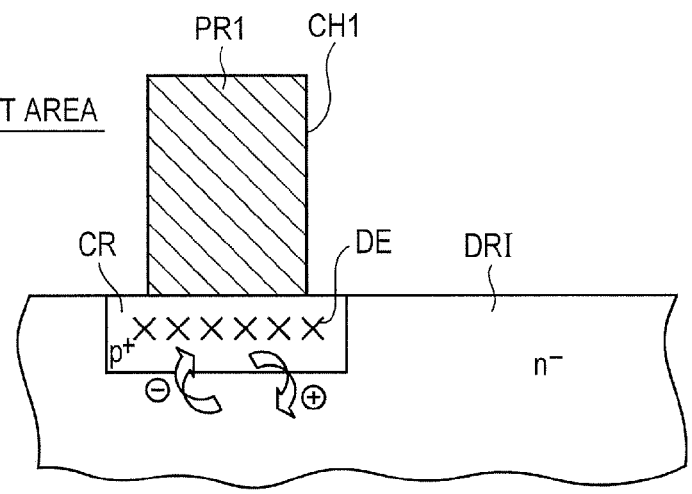
FIG. 15 is a schematic cross-sectional view illustrating the change in the characteristics of the IGBT when the contact area in the collector region is large.
Figure 16:
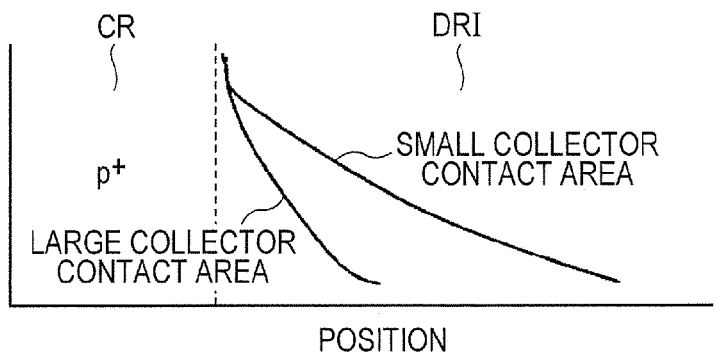
FIG. 16 is a view showing the distribution of the minority carrier density when the collector region is biased in the forward direction.

Referring to FIG. 15, crystal defects DF occur on the surface of the collector region CR due to etching damage in the process of forming the contact recess CH1, and due to the formation of a silicide on the main surface of the semiconductor substrate of a barrier metal (not shown) formed within the contact recess CH1. The number of crystal defects DF is proportional to the size of the collector contact area. In the crystal defect DF, the recombination of the hole and the electron occurs, and then the hole disappears. Thus, as shown in FIG. 16, the number (density) of holes, which are injected into the drift region DRI through the collector region CR from the plug layer PR1, varies according to the number of crystal defects DF. The resistance of the drift region DRI by the conductivity modulation would vary depending on the hole density, causing the amount of current to rise and fall.

In other words, when the collector contact area is large, the number of crystal defects DF on the surface of the collector region CR is increased. As a result, the number of holes injected into the drift region DRI through the collector region CR from the plug layer PR1 would be reduced, thus preventing the improvement of the current.

Figure 17:
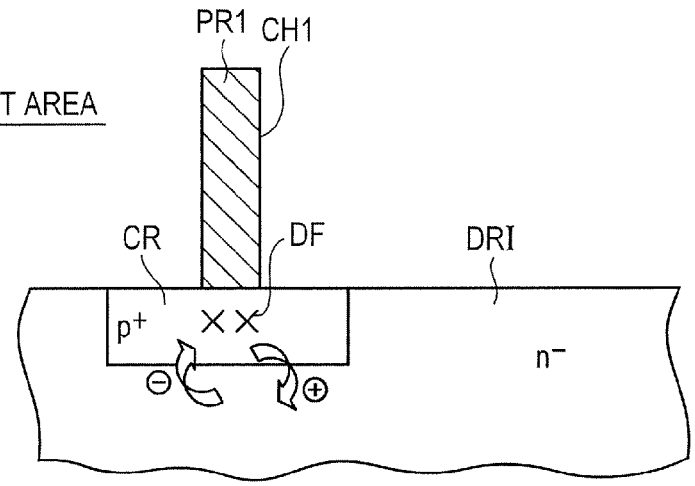
FIG. 17 a schematic cross-sectional view illustrating the change in the characteristics of the IGBT when the contact area in the collector region is large.

Referring to FIG. 17, when the collector contact area is small, the number of crystal defects DF on the surface of the collector region CR is reduced, so that the number of holes injected into the drift region DRI through the collector region CR from the plug layer PR1 is increased. As a result, the resistance of the drift region DRI by the conductivity modulation would be greatly reduced and the current would increase.

Next, the operation and effect of this embodiment will be described. As described above, in this embodiment, at least one of the two ratios, the ratio (the collector contact area/the collector active area) and the ratio (the contact area on the p+ region/the p+ region area) in the High Side IGBT, is higher than in the case of the Low Side IGBT. For this reason, the on-state breakdown voltage can be improved in the High Side IGBT. At the same time, the current (linear current, saturated current) can be improved in the Low Side IGBT. In other words, it is possible to improve the characteristics of the lateral IGBT, such as current improvement and on-stand breakdown voltage improvement, while reducing the development burden, by a small change such as contact size change, without making drastic changes and optimization such as device size change, impurity injection layout change, and impurity injection condition change.

Note that the contact size change can be controlled only by changing the contact mask. Thus, it is possible to readjust the experimentally produced contact mask at low cost.

In the above description, both the contact recess CH1 on the collector side and the contact recess CH2 on the emitter side have the line contact structure in the High Side IGBT and the Low Side IGBT. The contact area can be larger in the line contact structure than in the whole contact structure. As a result, it is possible to increase the controllability of the IGBT characteristics.

Figure 18:
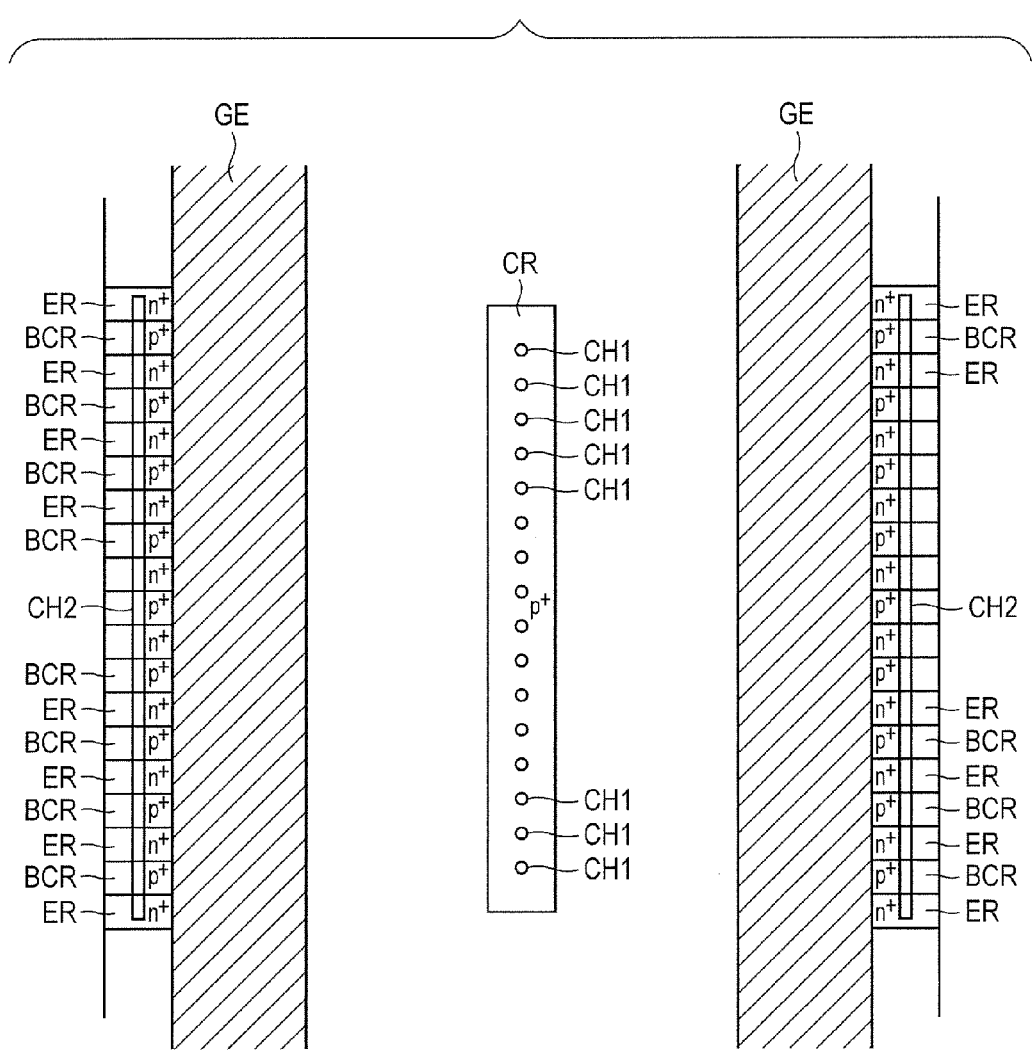
FIG. 18 is a schematic top view of the configuration of the IGBT in which the collector-side contact has a whole contact structure and the emitter-side contact has a line contact structure.

Further, in one or both of the High Side IGBT and the Low Side IGBT, as shown in FIG. 18, it is possible that the contact recess CH2 on the collector side has the whole contact structure, and the contact recess CH2 on the emitter side has the line contact structure. In this case also, since the emitter-side contact recess CH2 has the line contact structure, the contact area can be larger than using the whole contact structure. As a result, it is possible to improve the controllability of the IGBT characteristics.

Figure 28:
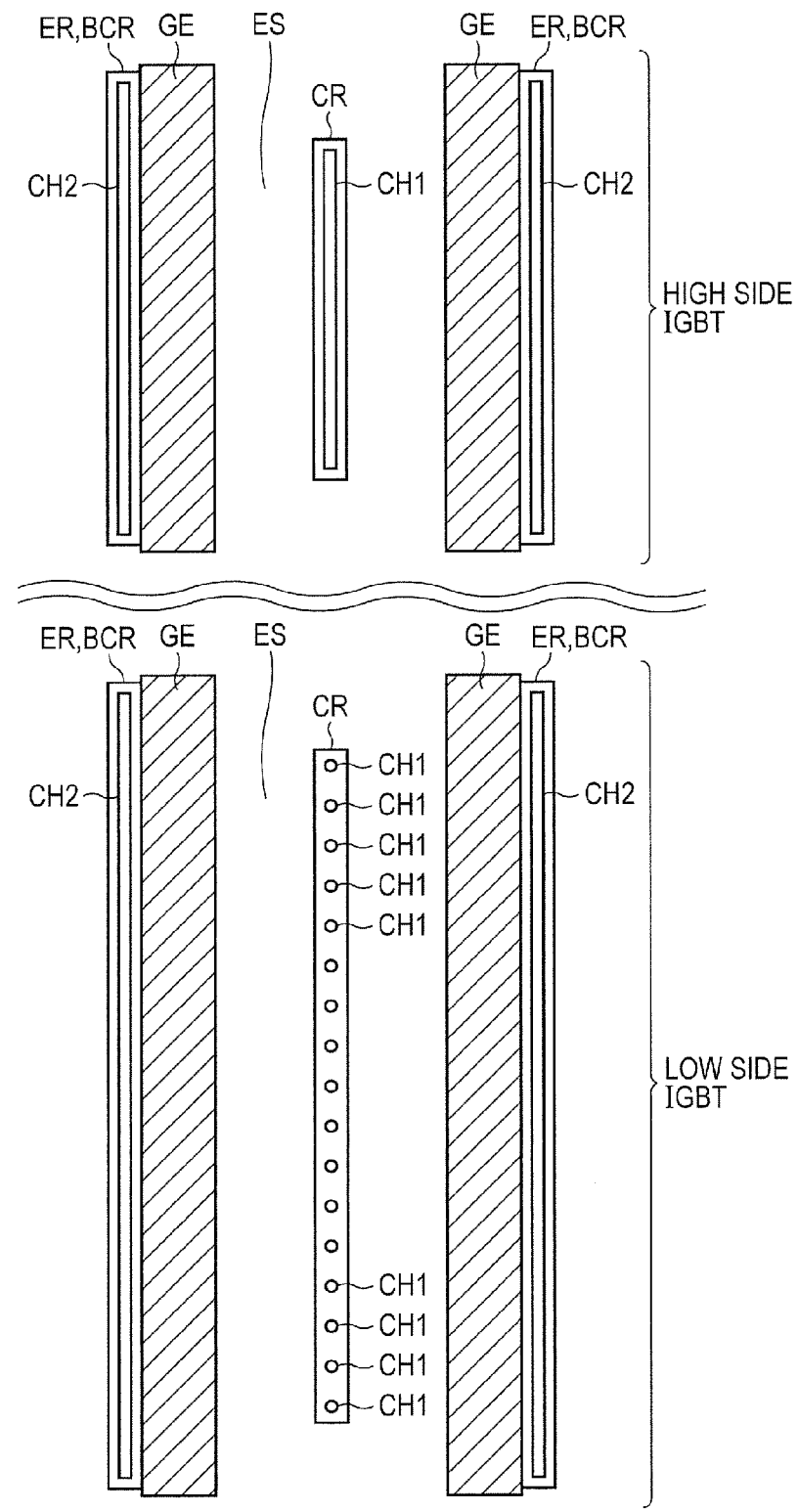
FIG. 28 is a schematic top view of the configuration of the High Side IGBT in which the collector-side and emitter-side contacts have the line contact structure, as well as the configuration of the Low Side IGBT in which the collector-side contact has the whole contact structure and the emitter-side contact has the line contact structure.

An example of using the above configuration is shown in FIG. 28. In the configuration shown in FIG. 28, in the High Side IGBT, for example, the collector-side contact recess CH1 and the emitter-side contact recess CH2 have the line contact structure. Then, in the Low Side IGBT, for example, the emitter-side contact recess CH2 has the line contact structure and the collector-side contact recess CH1 has the whole contact structure.

Figure 19:
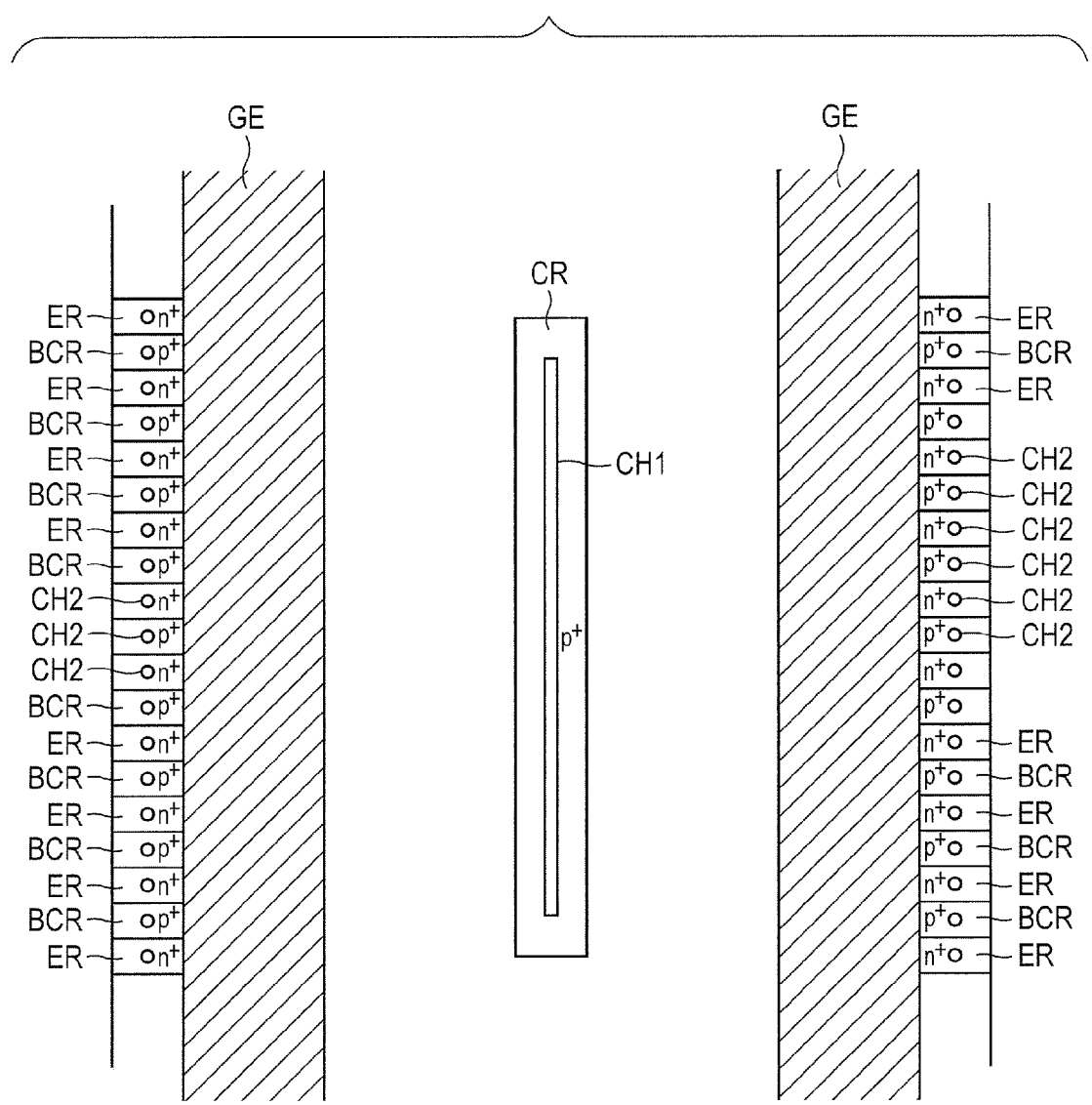
FIG. 19 is a schematic top view of the configuration of the IGBT in which the collector-side contact has the line contact structure and the emitter-side contact has the whole contact structure.

Further, in one or both of the High Side IGBT and the Low Side IGBT, as shown in FIG. 19, it is possible that the emitter-side contact recess CH2 has the whole contact structure, and the collector-side contact recess CH1 has the line contact structure. In this case also, since the collector-side contact recess CH1 has the line contact structure, the contact area can be larger than using the whole contact structure. As a result, it is possible to improve the controllability of the IGBT characteristics.

Further, in one or both of the High Side IGBT and the Low Side IGBT, both of the collector-side contact recess CH1 and the emitter-side contact recess CH2 may have the whole contact structure.

In this embodiment, as shown in FIGS. 3 and 4, the line contact structure is continuously extended without interruption. Thus, it is possible to prevent fluctuation of the characteristics due to the displacement and misalignment of the contact recesses CH1 and CH2.

Further, the line width W1A (or W2A) of the junction of the plug layer PR1 and the $p^+$ collector region CR in each of the High Side IGBT and the Low Side IGBT, may be greater or smaller than the line width W1B (or W2B) of the junction of the plug layer PR2 and the $p^+$ base contact region CR.

Second Embodiment

Figure 20:
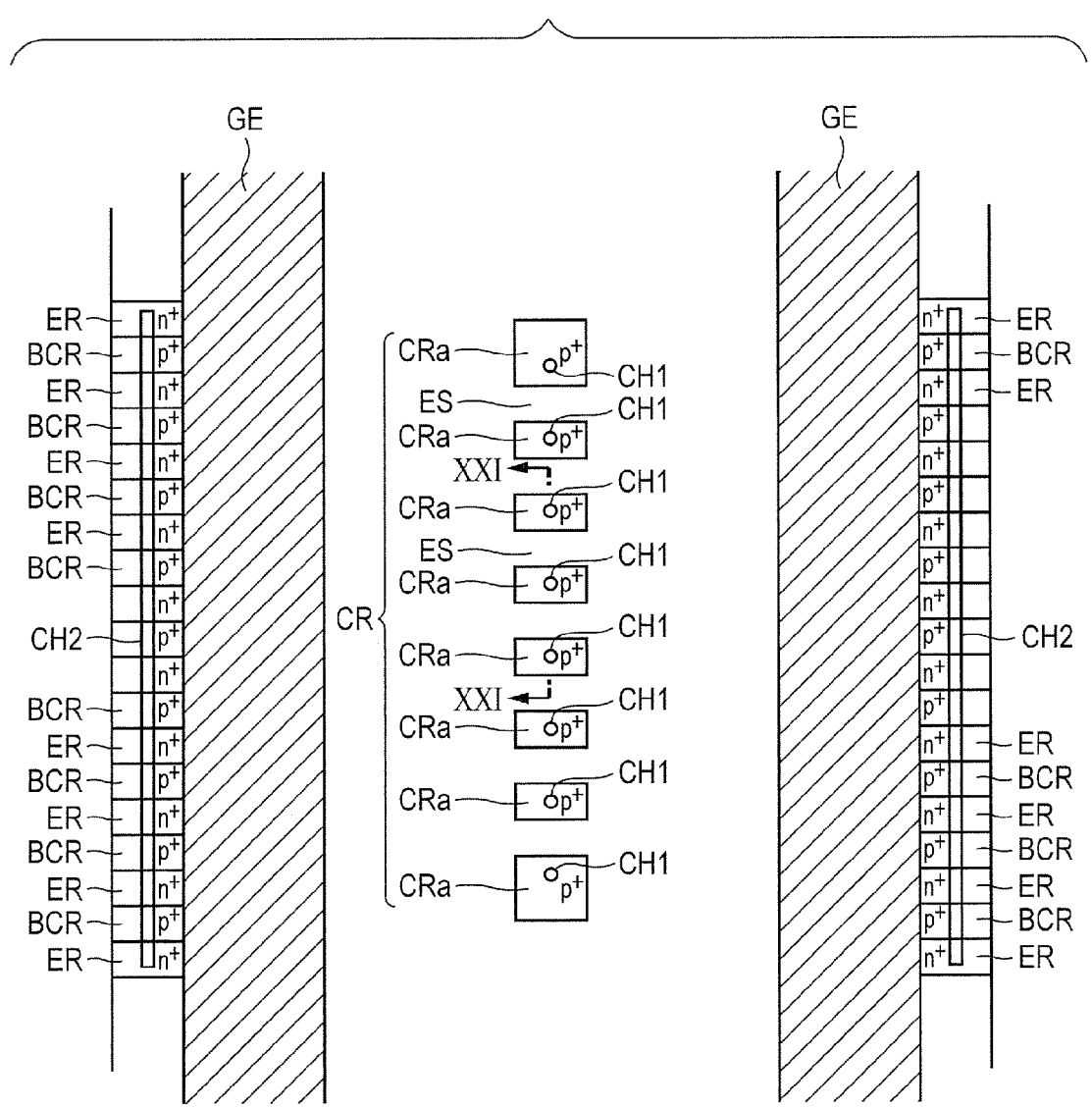
FIG. 20 is a schematic top view of the configuration of the IGBT in which the contact-side contact has the whole contact structure and the collector region is thinned (divided) by a device isolation structure.
Figure 21:
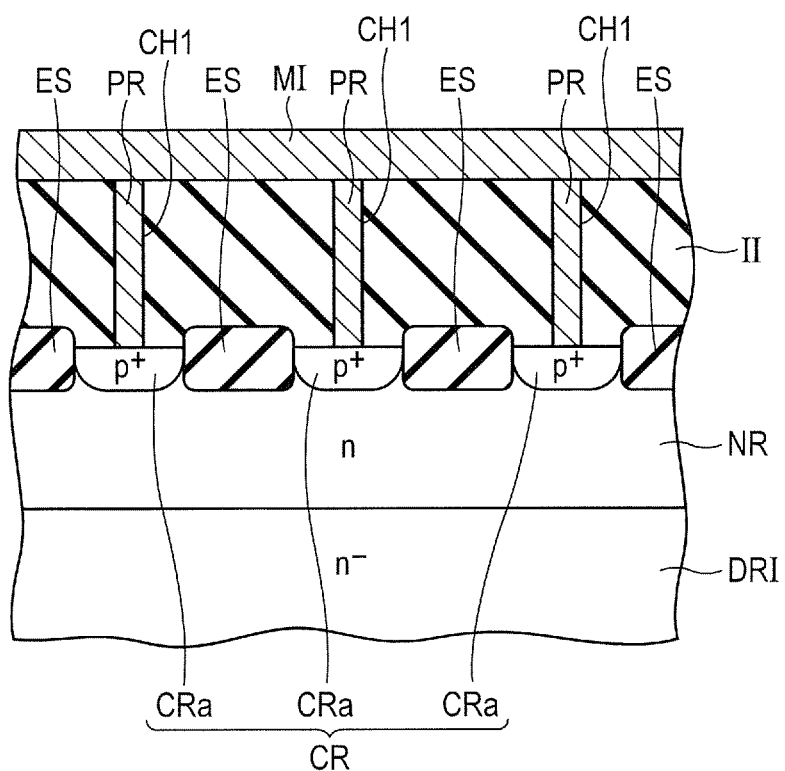
FIG. 21 is a schematic cross-sectional view taken along line XXI-XXI in FIG. 20.

Referring to FIGS. 20 and 21, the configuration of the second embodiment is different from the configuration of the first embodiment in that the $p^+$ collector region CR is thinned (divided) by the device isolation structure ES. In other words, in one IGBT, the $p^+$ collector region CR is divided into a plurality of $p^+$ collector region portions CRa by the device isolation structure ES. As described in the first embodiment, the device isolation structure ES may be a silicon oxide film formed by LOCOS or may be STI.

The contact recess CH1 on the collector side has the whole contact structure. In this case, the collector-side contact recess CH1 reaches each of the $p^+$ collector region portions CRa, but does not reach the device isolation structure ES. The device isolation structure ES is interposed between the adjacent $p^+$ collector region portions CRa. The device isolation structure ES is covered by the interlayer insulating film II.

Note that other configurations of the second embodiment are substantially the same as the configurations of the first embodiment. Thus, like components are denoted by like reference numerals and description thereof will not be repeated.

Figure 22:
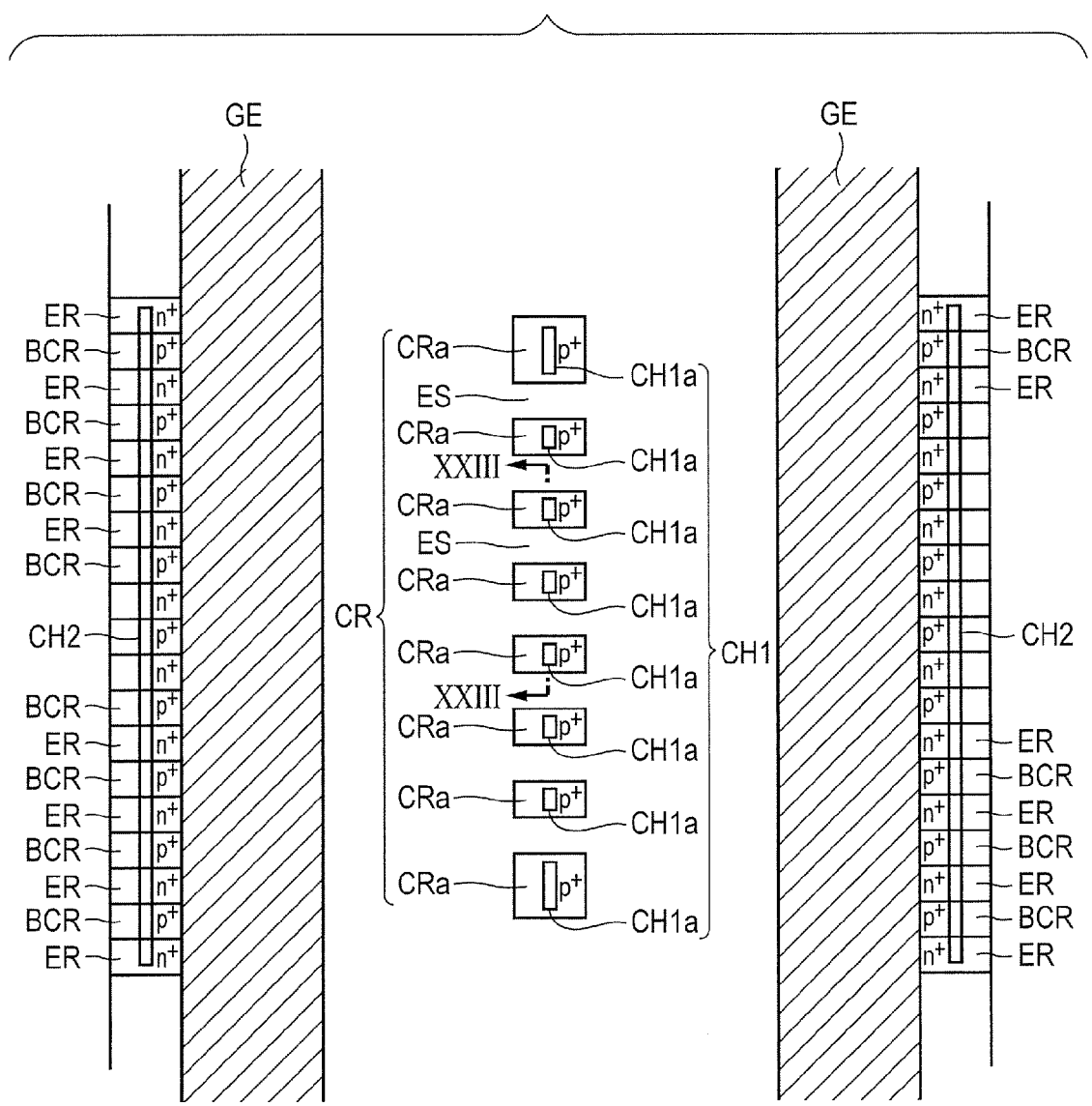
FIG. 22 is a schematic top view of the configuration of the IGBT in which the collector-side contact has the line contact structure and the collector region is thinned (divided) by the device isolation structure.
Figure 23:
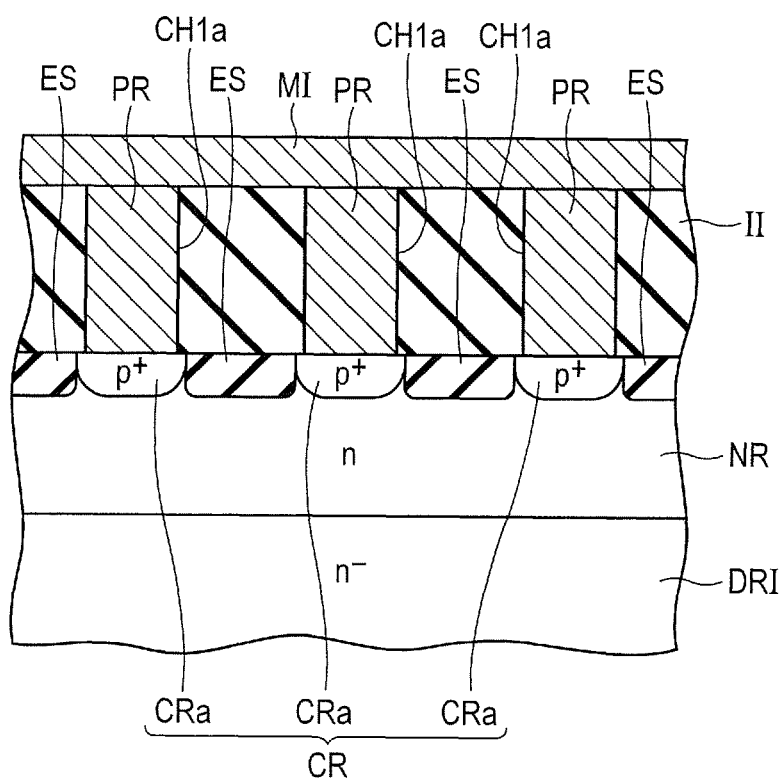
FIG. 23 is a schematic cross-sectional view taken along line XXIII-XXIII in FIG. 22.

In FIGS. 20 and 21, the description assumes that the collector-side contact recess CH1 has the whole contact structure. However, it is also possible to use the line contact structure for the collector-side contact recess CH1 as shown in FIGS. 22 and 23. In the case of the line contact structure shown in FIGS. 22 and 23, the recess CH1 of the line contact structure is divided into a plurality of line contact recess portions CH1$a$ that are arranged in series. Then, each of the line contact recess portions CH1$a$ reaches each of the $p^+$ collector region portions CRa but does not reach the device isolation structure ES.

According to the second embodiment, the $p^+$ collector region CR is thinned by the device isolation structure ES, so that the current can be improved. Further, the configuration in which the $p^+$ collector region CR is thinned by the device isolation structure ES, can be produced only by changing a field mask. Thus, the configuration can be produced at low cost.

Third Embodiment

Figure 24:
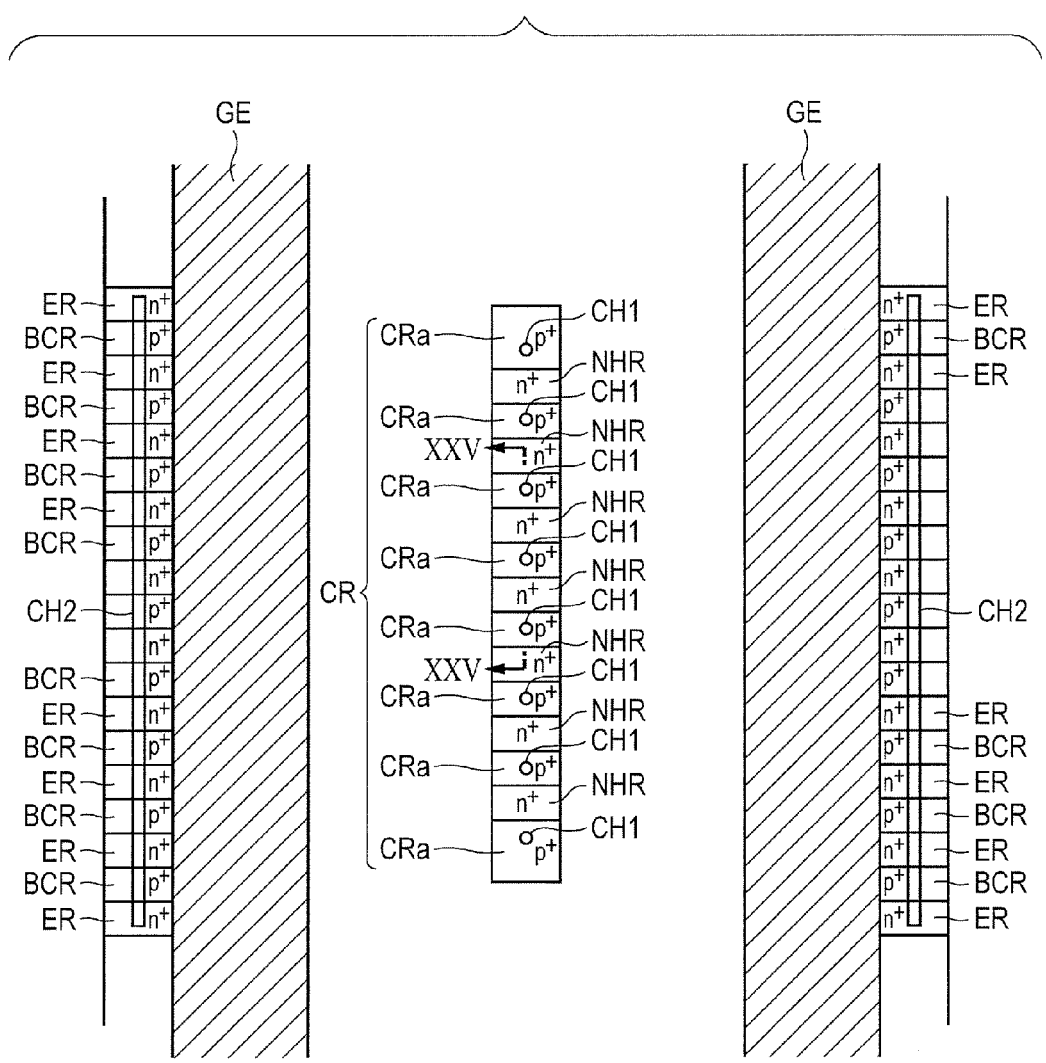
FIG. 24 is a schematic cross-sectional view of the configuration in which the collector-side contact has the whole contact structure and the collector region is thinned (divided) by $n^+$ regions.
Figure 25:
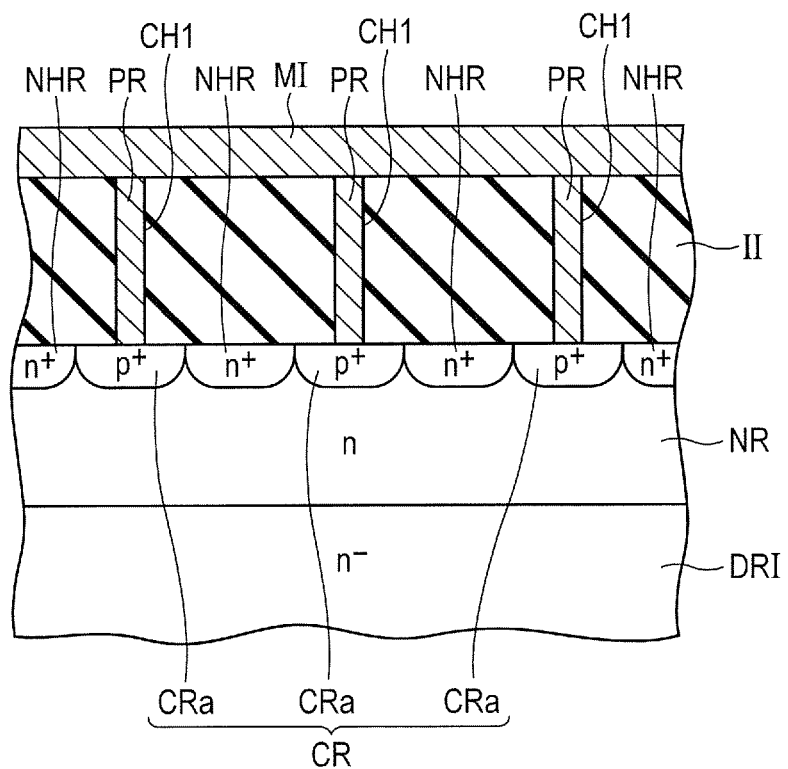
FIG. 25 is a schematic cross-sectional view taken along line XXV-XXV in FIG. 24.

Referring to FIGS. 24 and 25, the configuration of the third embodiment is different from the configuration of the first embodiment in that the $p^+$ collector region CR is thinned (divided) by $n^+$ isolation regions NHR. In other words, in one IGBT, the $p^+$ collector region CR is divided into a plurality of $p^+$ collector region portions CRa that are separated by a plurality of $n^+$ isolation regions NHR. Each of the $n^+$ isolation regions NHR has an n-type impurity concentration higher than the n-type region NR.

The collector-side contact recess CH1 has the whole contact structure. In this case, the collector-side contact recess CH1 reaches each of the $p^+$ collector region portions CRa but does not reach the device isolation structure ES. The device isolation structure ES is interposed between the adjacent $p^+$ collector region portions CRa. The device isolation structure ES is covered by the interlayer insulating film II.

Note that other configurations of the third embodiment are substantially the same as the configurations of the first embodiment. Thus, like components are denoted by like reference numerals and description thereof will not be repeated.

Figure 26:
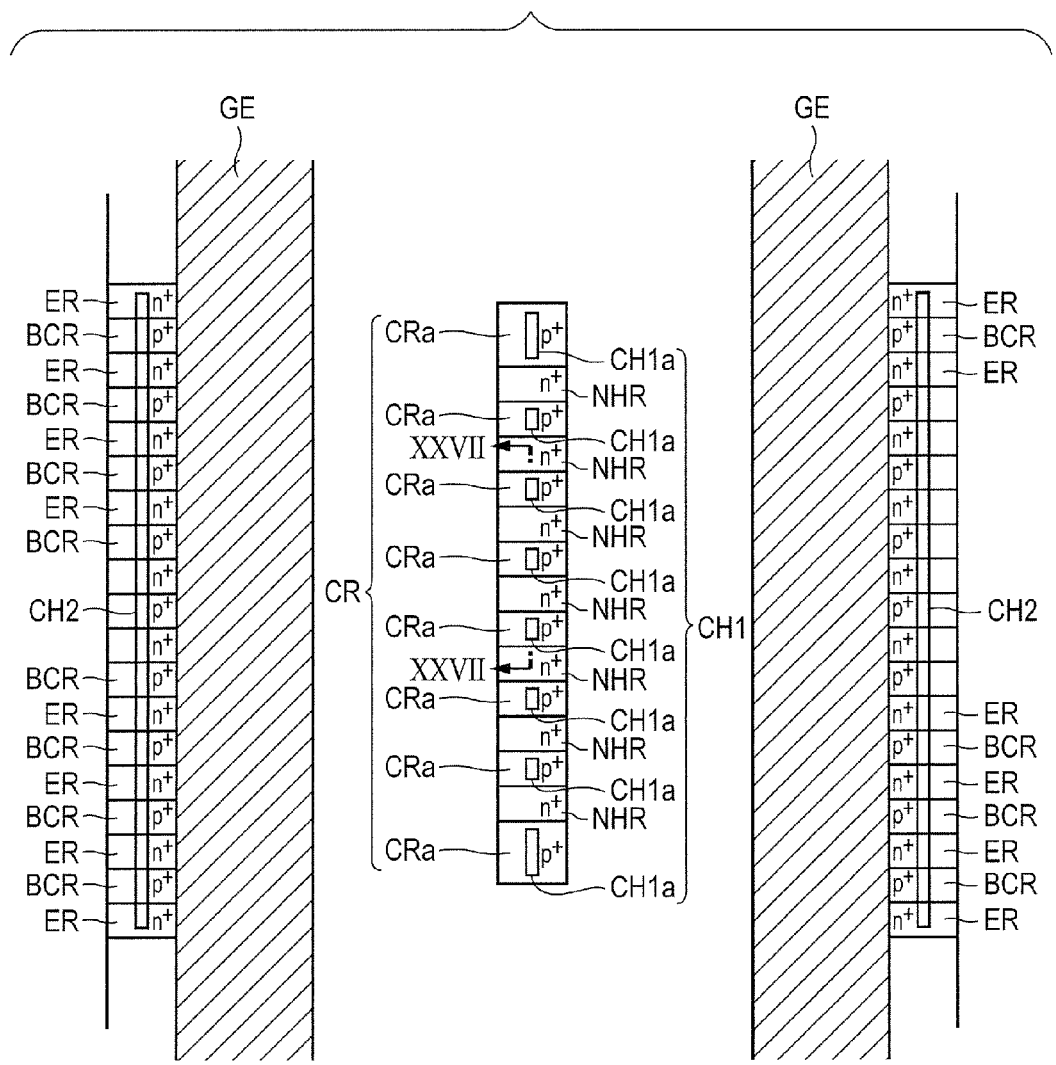
FIG. 26 is a schematic top view of the configuration in which the collector-side contact has the line contact structure and the collector region is thinned (divided) by the $n^+$ regions.
Figure 27:
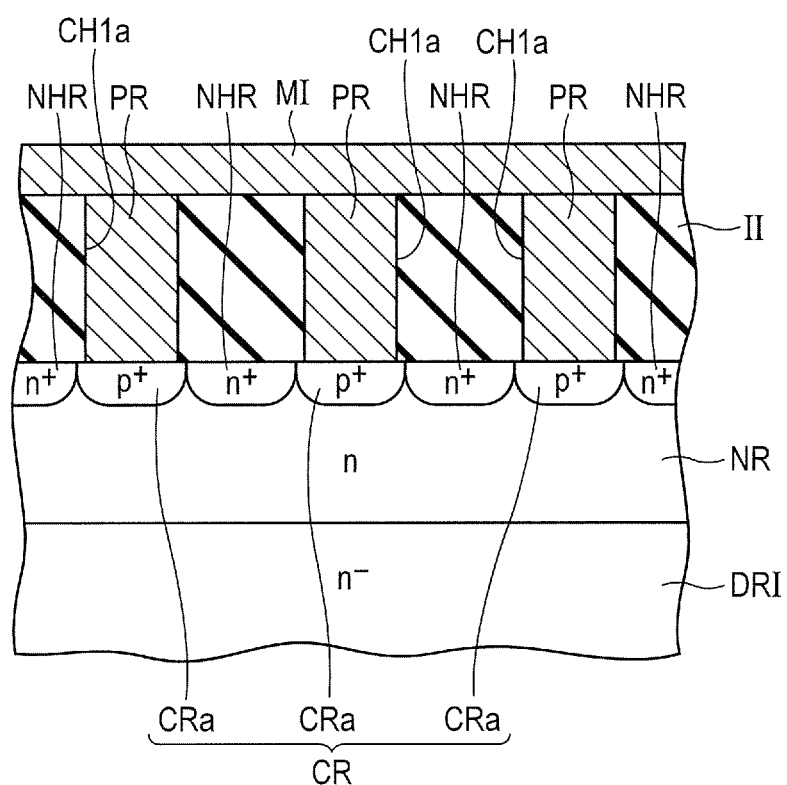
FIG. 27 is a schematic cross-sectional view taken along line XXVII-XXVII in FIG. 26.

Further, in FIGS. 24 and 25, the description assumes that the collector-side contact recess CH1 has the whole contact structure. However, it is also possible to use the line contact structure for the collector-side contact recess CH1 as shown in FIGS. 26 and 27. In the case of the line contact structure shown in FIGS. 26 and 27, the recess CH1 of the line contact structure is divided into a plurality of line contact recess portions CH1$a$ that are arranged in series. Then, each of the line contact recess portions CH1$a$ reaches each of the $p^+$ collector region portions CRa but does not reach the $n^+$ isolation region NHR.

According to the third embodiment, the $p^+$ collector region CR is thinned by the $n^+$ isolation region NHR, so that the current can be improved. Further, the configuration in which the $p^+$ collector region CR is thinned by the $n^+$ isolation region NHR can be produced only by changing the impurity injection mask for forming the $p^+$ collector region CR and the $n^+$ isolation region NHR. Thus, the configuration can be produced at low cost.

Fourth Embodiment

Figure 29:
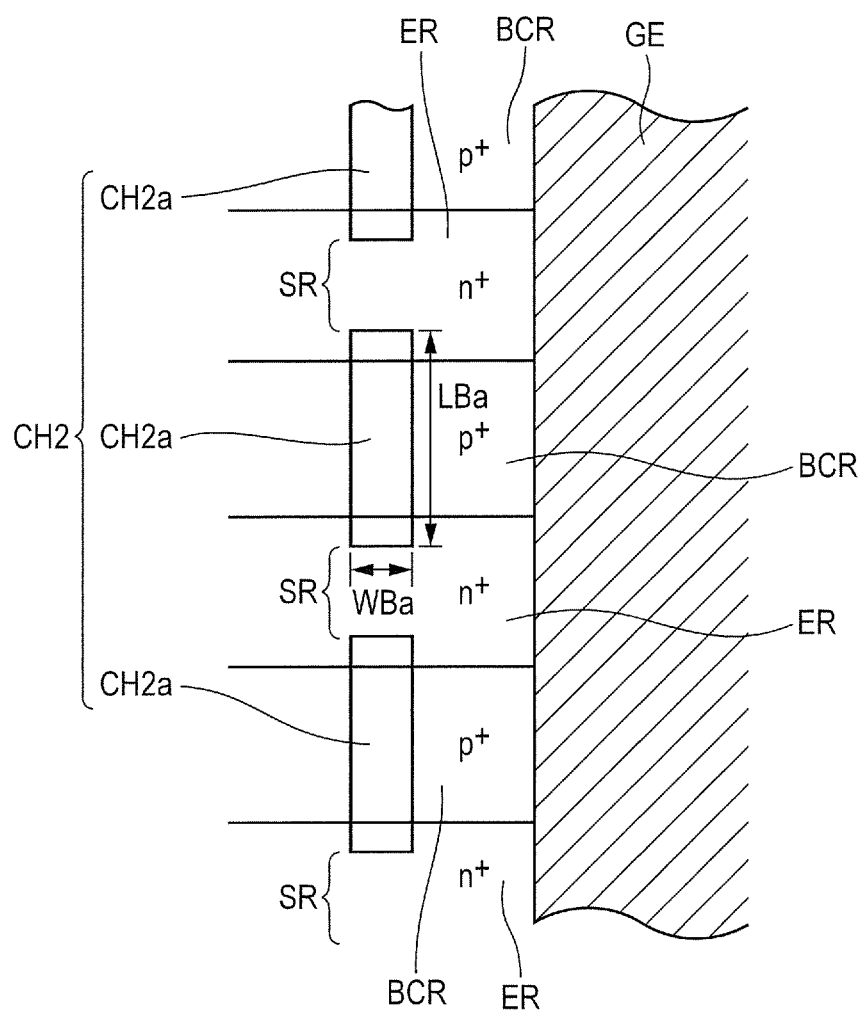
FIG. 29 is a top view schematically showing a first example of the configuration in which the emitter-side line contact is divided.

Referring to FIG. 29, the configuration of the fourth embodiment is different from the configuration of the first embodiment in that the emitter-side contact recess CH2 is divided into a plurality of line contact portions CH2$a$ that are arranged in series. Each of the line contact portions CH2$a$ has the line contact structure. In other words, each of the line contact portions CH2$a$ has a substantially rectangular shape in the top view shown in FIG. 29. In this case, a length LBa of one side is equal to or longer than twice a length WBa of the other side in the top view. Further, in the top view, only the n-type region (n+ emitter region ER) is located in the region just below an isolated portion SR located between the adjacent line contact portions CH2a.

Note that other configurations of the fourth embodiment are substantially the same as the configurations of the first embodiment. Thus, like components are denoted by like reference numerals and description thereof will not be repeated.

In the fourth embodiment, the emitter-side contact recess CH2 is divided into a plurality of line contact portions CH2a. Here, when the line contact structure is long, the difference in the line width between the end and the center in the longitudinal direction of the line contact structure increases due to photoresist shrinkage and the like. However, in the fourth embodiment, the length in the longitudinal direction of each of the divided line contact portions CH2a is shorter than the length in the longitudinal direction of the contact recess CH2 that is not divided. For this reason, it is possible to increase the stability of the finished size of the contact recess CH2.

Further, in the fourth embodiment, only the n-type region (the n+ emitter region ER) is located in the region just below the isolated portion SR located between the adjacent line contact portions CH2a. Thus, it is possible to prevent the fluctuation of the on-state breakdown voltage due to the displacement and misalignment of the contact recesses CH2.

Figure 30:
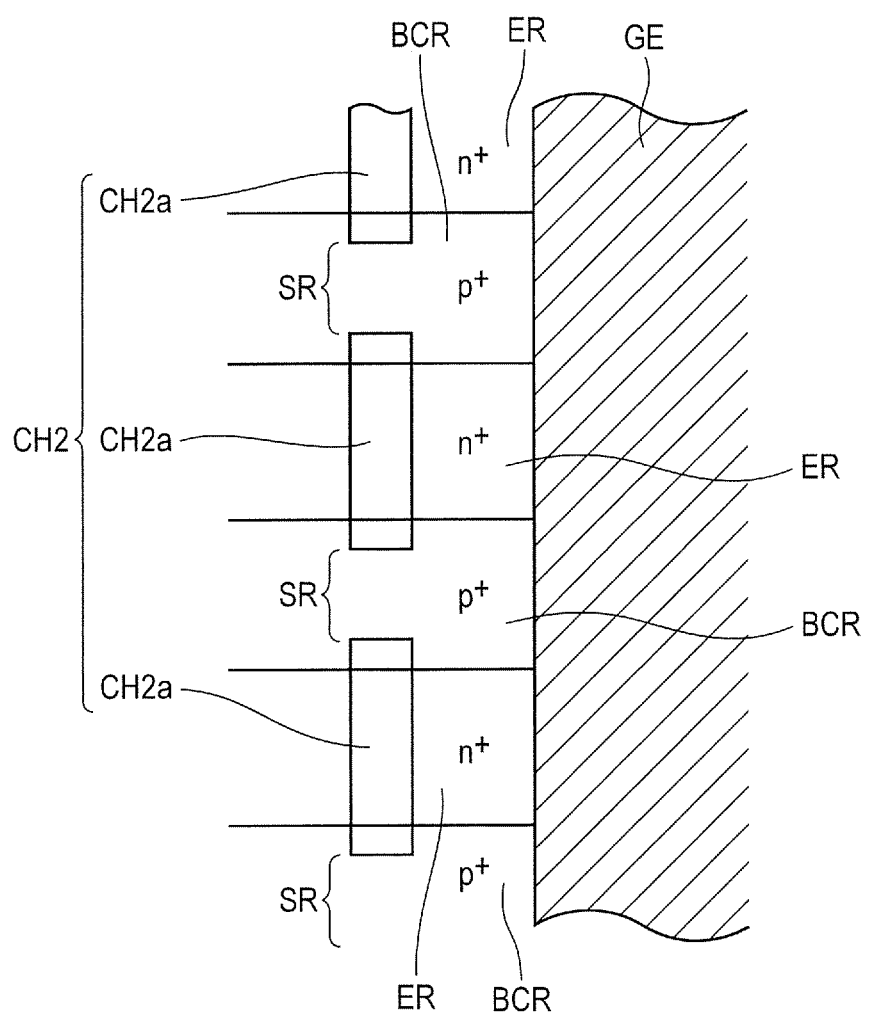
FIG. 30 is a top view schematically showing a second example of the configuration in which the emitter-side line contact is divided.

Further, as shown in FIG. 30, it is also possible that only the p-type region (the p+ base contact region BCR) is located in the region just below the isolated portion SR located between the adjacent line contact portions CH2a in the top view. In this case, it is possible to prevent the fluctuation of the current due to the displacement and misalignment of the contact recess CH2.

Figure 31:
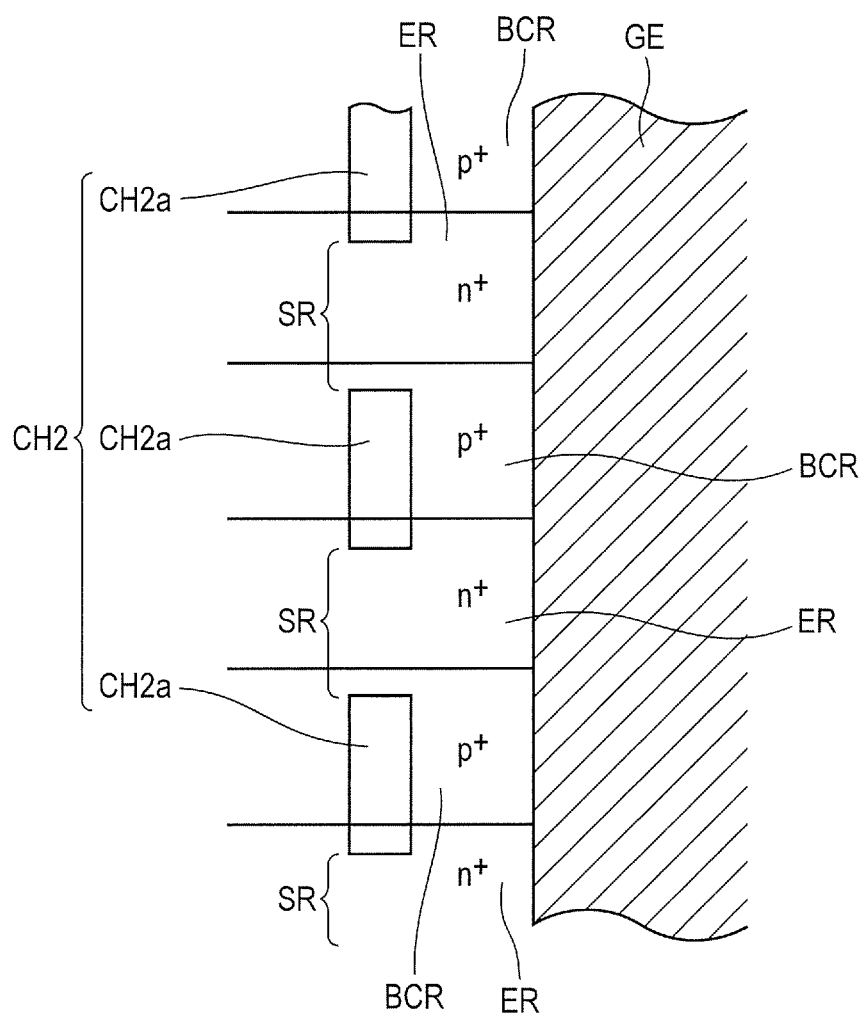
FIG. 31 is a top view schematically showing a third example of the configuration in which the emitter-side line contact is divided.
Figure 32:
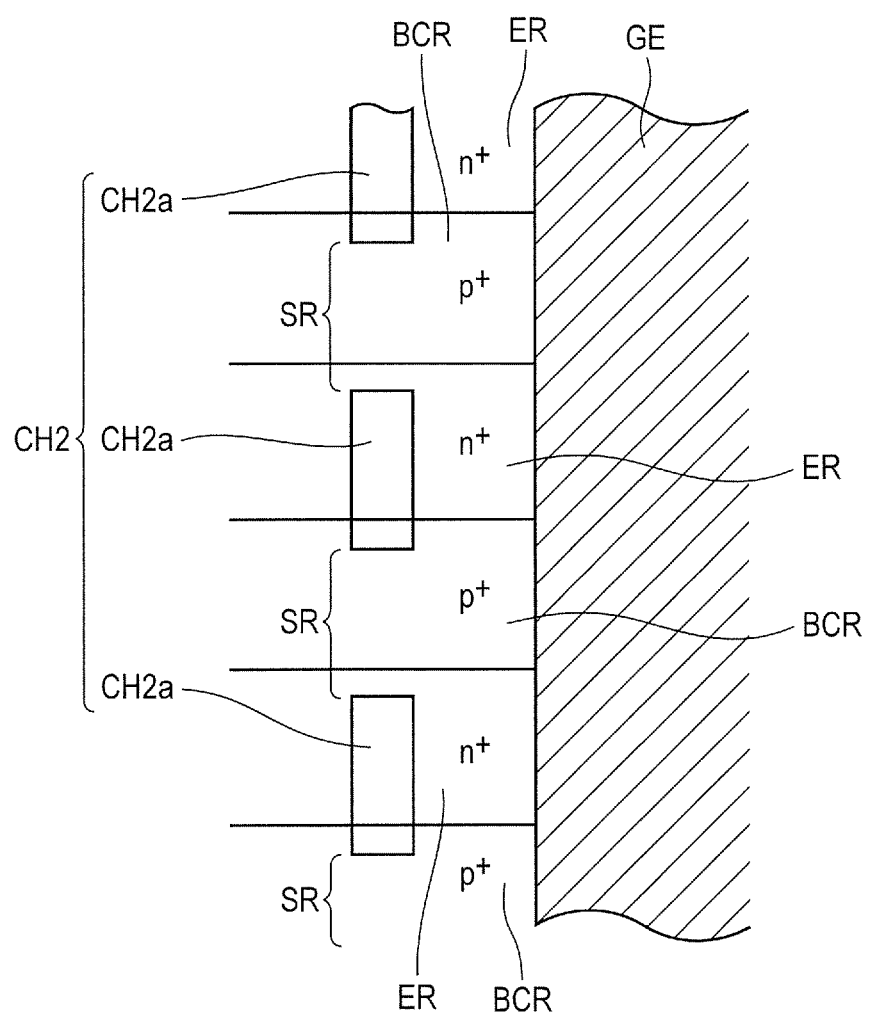
FIG. 32 is a top view schematically showing a fourth example of the configuration in which the emitter-side line contact is divided.
Figure 33:
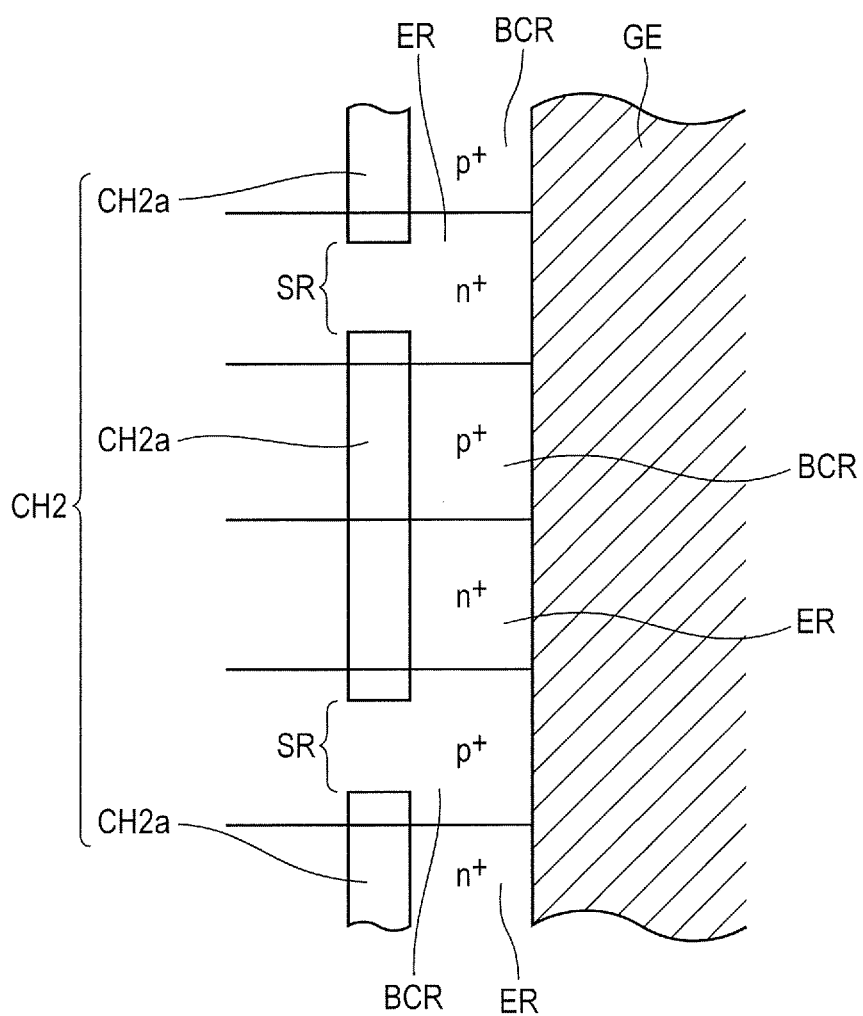
FIG. 33 is a top view schematically showing a fifth example of the configuration in which the emitter-side line contact is divided.

Further, as shown in FIGS. 31 to 33, it is possible that both the n-type region (the n+ emitter region ER) and the p-type region (p+ base contact region BCR) are located just below the isolated portion SR located between the adjacent line contact portions CH2a in the top view.

As shown in FIG. 31, the area of the portion of the n-type region (the n+ emitter region ER) located just below the isolated portion SR, maybe greater than the area of the portion of the p-type region (the p+ base contact region BCR) located just below the isolated portion SR. In this case, similarly to the configuration shown in FIG. 29, it is possible to prevent the fluctuation of the on-state breakdown voltage due to the displacement and misalignment of the contact recess CH2.

Further, as shown in FIG. 32, the area of the portion of the p-type region (the p+ base contact region BCR) located just below the isolated portion SR, maybe greater than the area of the portion of the n-type region (the n+ emitter region ER) located just below the isolated portion SR. In this case, similarly to the configuration shown in FIG. 30, it is possible to prevent the fluctuation of the current due to the displacement and misalignment of the contact recess CH2.

Further, as shown in FIG. 33, the area of the portion of the n-type region (the n+ emitter region ER) located just below the isolated portion SR may be the same as the area of the portion of the p-type region (the p+ base contact region BCR) located just below the isolated portion SR. In this case, similarly to the configuration shown in FIG. 30, it is possible to prevent the fluctuation of the current due to the displacement and misalignment of the contact recess CH2.

In the above embodiment, the description assumes that the emitter-side contact recess CH2 has a plurality of line contact portions CH2a. However, it is also possible that the collector-side contact recess CH1 is divided into a plurality of line contact portions that are arranged in series.

Note that in FIG. 3 and FIG. 28, it is assumed that the gate electrode layer GE and the n+ emitter region ER are linearly arranged parallel to the p+ collector region CR. However, it is also possible that the gate electrode layer GE and the n+ emitter region ER are arranged around the p+ collector region CR in the top view. Further, both the breakdown voltage oriented IGBT and the current oriented IGBT may be formed by a mono-crystalline silicon substrate or a silicon-on-insulator (SOI) substrate.

Further, in the embodiments described above, the semiconductor device has the PDP scan driver circuit, which includes the breakdown voltage oriented IGBT and the current oriented IGBT. However, the present invention is not limited to such a semiconductor device. The present invention can also be applied to semiconductor devices having two IGBTs with different characteristics from each other.

The embodiments disclosed herein are to be considered in all respects as illustrative and not restrictive. The scope of the present invention is indicated by the appended claims, rather than by the foregoing description, and all changes which come within the meaning and range of equivalency of the claims are therefore intended to be embraced therein.

The present invention can be advantageously applied to semiconductor devices including two IGBTs with different characteristics from each other.

What is claimed is:

1. A semiconductor device comprising:
a semiconductor substrate having a main surface; and
first and second insulated gate bipolar transistors formed on the main surface, respectively,
wherein each of the first and second insulated gate bipolar transistors includes:
a first conductive collector region formed on the main surface;
a first conductive base region formed on the main surface separately from the collector region;
a second conductive emitter region formed on the main surface in the base region;
an emitter conductive layer coupled to both the base region and the emitter region of each of the first and second insulated gate bipolar transistors; and
a collector conductive layer coupled to the collector region of each of the first and second insulated gate bipolar transistors, and
wherein the ratio (SB11/SA11) of the area (SB11) of the junction of the base region and the emitter conductive layer in the first insulated gate bipolar transistor, to the area (SA11) in the main surface of the base region of the first insulated gate bipolar transistor, is greater than the ratio (SB21/SA21) of the area (SB21) of the junction of the base region and the emitter conductive layer of the second insulated gate bipolar transistor, to the area (SA21) of the base region in the main surface of the second insulated gate bipolar transistor.

2. The semiconductor device according to claim 1,
wherein the junction of the base region and the emitter conductive layer of the first insulated gate bipolar transistor has a line contact structure,
wherein the junction of the base region and the emitter conductive layer of the second insulated gate bipolar transistor has the line contact structure, and
wherein the line width in the line contact structure of the first insulated gate bipolar transistor is greater than the line width in the line contact structure of the second insulated gate bipolar transistor.

3. The semiconductor device according to claim 1,
wherein the junction of the base region and the emitter conductive layer of the first insulated gate bipolar transistor has a line contact structure, and
wherein the junction of the base region and the emitter conductive layer of the second insulated gate bipolar transistor has a whole contact structure.

4. The semiconductor device according to claim 2 or 3,
wherein the line contact structure has a plurality of line contact portions that are separated from each other and are arranged in series, and
wherein only the second conductive emitter region is located just below an isolated portion located between the line contact portions arranged in series.

5. The semiconductor device according to claim 2 or 3,
wherein the line contact structure has a plurality of line contact portions that are separated from each other and are arranged in series,
wherein the first conductive base region and the second conductive emitter region are located just below an isolated portion located between the line contact portions arranged in series, and
wherein the area in the main surface of the emitter region located just below the isolated portion is greater than the area in the main surface of the base region located just below the isolated portion.

6. The semiconductor device according to claim 2 or 3,
wherein the line contact structure has a plurality of line contact portions that are separated from each other and are arranged in series, and
wherein only the first conductive base region is located just below an isolated portion located between the line contact portions arranged in series.

7. The semiconductor device according to claim 2 or 3,
wherein the line contact structure has a plurality of line contact portions that are separated from each other and are arranged in series,
wherein the first conductive base region and the second conductive emitter region are located just below an isolated portion located between the line contact portions arranged in series, and
wherein the area in the main surface of the base region located just below the isolated portion is greater than the area in the main surface of the emitter region located just below the isolated portion.

8. The semiconductor device according to claim 2 or 3,
wherein the line contact structure has a plurality of line contact portions that are separated from each other and are arranged in series,
wherein the first conductive base region and the second conductive emitter region are located just below an isolated portion located between the line contact portions arranged in series, and
wherein the area in the main surface of the base region located just below the isolated portion is the same as the area in the main surface of the emitter region located just below the isolated portion.

9. A semiconductor device comprising:
a semiconductor substrate having a main surface; and
first and second insulated gate bipolar transistors formed on the main surface, respectively,
wherein each of the first and second insulated gate bipolar transistors includes:
a first conductive collector region formed on the main surface;
a first conductive base region formed on the main surface separately from the collector region;
a second conductive emitter region formed on the main surface in the base region;
an emitter conductive layer coupled to both the base region and the emitter region in each of the first and second insulated gate bipolar transistors; and
a collector conductive layer coupled to the collector region of each of the first and second insulated gate bipolar transistors, and
wherein the ratio (SB12/SA12) of the area (SB12) of the junction of the collector region and the collector conductive layer in the first insulated gate bipolar transistor, to the area (SA12) in the main surface of the collector region of the first insulated gate bipolar transistor, is greater than the ratio (SB22/SA22) of the area (SB22) of the junction of the collector region and the collector conductive layer of the second insulated gate bipolar transistor, to the area (SA22) in the main surface of the collector region of the second insulated gate bipolar transistor.

10. The semiconductor device according to claim 9,
wherein the junction of the collector region and the collector conductive layer in the first insulated gate bipolar transistor has a line contact structure,
wherein the junction of the collector region and the collector conductive layer in the second insulated gate bipolar transistor has the line contact structure, and
wherein the line width in the line contact structure of the first insulated gate bipolar transistor is greater than the line width in the line contact structure of the second insulated gate bipolar transistor.

11. The semiconductor device according to claim 9,
wherein the junction of the collector region and the collector conductive layer of the first gate bipolar transistor has a line contact structure, and
wherein the junction of the collector region and the collector conductive layer of the second gate bipolar transistor has a whole contact structure.

12. The semiconductor device according to claim 1 or 9, wherein the breakdown voltage of the first insulated gate bipolar transistor is higher than the breakdown voltage of the second insulated gate bipolar transistor.

13. The semiconductor device according to claim 1 or 9,
wherein the semiconductor device further comprises a device isolation structure formed on the main surface, and
wherein the collector region of at least one of the first and second insulated gate bipolar transistors includes a plurality of collector divided regions that are separated from each other by the device isolation structure.

14. The semiconductor device according to claim 1 or 9,
wherein the semiconductor device further comprises a second conductive impurity region formed on the main surface, and
wherein the collector region of at least one of the first and second insulated gate bipolar transistors includes a plurality of collector divided regions that are separated from each other by the impurity region.

15. The semiconductor device according to any one of claims 2, 3, 10, or 11, wherein the line contact structure is continuously extended without interruption.

16. The semiconductor device according to any one of claims 2, 3, 10, or 11, wherein the line contact structure has a plurality of line contact portions that are separated from each other and are arranged in series.

* * * * *